US008829357B2

(12) United States Patent
Mikado et al.

(10) Patent No.: US 8,829,357 B2
(45) Date of Patent: Sep. 9, 2014

(54) WIRING BOARD AND METHOD FOR MANUFACTURING THE SAME

(75) Inventors: Yukinobu Mikado, Ogaki (JP); Shunsuke Sakai, Ogaki (JP); Mitsuhiro Tomikawa, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 122 days.

(21) Appl. No.: 13/307,480

(22) Filed: Nov. 30, 2011

(65) Prior Publication Data

US 2012/0186866 A1    Jul. 26, 2012

(30) Foreign Application Priority Data

Jan. 20, 2011 (JP) ................................. 2011-010309
Jul. 13, 2011 (JP) ................................. 2011-155277

(51) Int. Cl.
H05K 1/16 (2006.01)
H05K 3/00 (2006.01)
H05K 1/18 (2006.01)
H05K 3/46 (2006.01)
H05K 3/42 (2006.01)

(52) U.S. Cl.
CPC ........ H05K 1/185 (2013.01); *H05K 2203/1572* (2013.01); *H05K 2203/1476* (2013.01); *H05K 3/427* (2013.01); H05K 3/0038 (2013.01); *H05K 2201/09536* (2013.01); *H05K 2201/10015* (2013.01); *H05K 2201/09563* (2013.01); *H05K 2201/09854* (2013.01); H05K 3/4602 (2013.01)
USPC ......................................... 174/260; 174/262

(58) Field of Classification Search
CPC ... H05K 1/185; H05K 3/0038; H05K 3/4602; H05K 3/427; H05K 2203/1572; H05K 2201/09563; H05K 2201/09854; H05K 2201/10015; H05K 2203/1476; H05K 2201/095

USPC ............................................................ 29/832
See application file for complete search history.

(56) References Cited

U.S. PATENT DOCUMENTS 5,224,265 A * 7/1993 Dux et al. ......................... 29/852
6,159,767 A * 12/2000 Eichelberger ................. 438/107

(Continued)

FOREIGN PATENT DOCUMENTS

JP      2002-246757 A      8/2002
JP   020003046248 A   *   2/2003

(Continued)

OTHER PUBLICATIONS

U.S. Appl. No. 13/307,480, filed Nov. 30, 2011, Shimizu, et al.
U.S. Appl. No. 13/332,463, filed Dec. 21, 2011, Mikado, et al.

*Primary Examiner* — Ishwarbhai B Patel
(74) *Attorney, Agent, or Firm* — Oblon, Spivak, McClelland, Maier & Neustadt, L.L.P.

(57) ABSTRACT

A wiring board includes a core substrate having an opening portion and a through hole adjacent to the opening portion, a capacitor positioned in the opening portion, and a through-hole conductor formed in the through hole of the core substrate and having a conductor filling the through hole. The core substrate has a first surface and a second surface on the opposite side of the first surface, the opening portion of the core substrate penetrates from the first surface to the second surface, the through-hole conductor has a first conductive portion and a second conductive portion connected to the first conductive portion in the core substrate, the first conductive portion of the through-hole conductor becomes narrower from the first surface toward the second surface, and the second conductive portion of the through-hole conductor becomes narrower from the second surface toward the first surface.

18 Claims, 29 Drawing Sheets

(56) References Cited

U.S. PATENT DOCUMENTS

| | | |
|---|---|---|
| 7,906,370 B2 * | 3/2011 | Morita ............................ 438/106 |
| 8,116,066 B2 * | 2/2012 | Inoue ............................ 361/321.4 |
| 8,222,539 B2 * | 7/2012 | Kawamura et al. ............ 174/262 |
| 2002/0186552 A1 | 12/2002 | Kimura et al. |
| 2003/0137056 A1 | 7/2003 | Taniguchi et al. |
| 2004/0014317 A1 | 1/2004 | Sakamoto et al. |
| 2009/0139751 A1 * | 6/2009 | Sunohara ........................ 174/255 |
| 2009/0205202 A1 | 8/2009 | Tanaka et al. |
| 2009/0215231 A1 | 8/2009 | Inoue |
| 2010/0224397 A1 | 9/2010 | Shimizu et al. |
| 2010/0300740 A1 | 12/2010 | Ichiyanagi et al. |

FOREIGN PATENT DOCUMENTS

| | | |
|---|---|---|
| JP | 2003-218525 A | 7/2003 |
| JP | 2007-266197 | 10/2007 |
| JP | 2009-194382 A | 8/2009 |
| JP | 2009-200389 A | 9/2009 |
| JP | 2010-212652 A | 9/2010 |
| JP | 2011-14882 A | 1/2011 |
| TW | 200731908 | 8/2007 |
| TW | 200738092 | 10/2007 |
| WO | WO 00/63970 A1 | 10/2000 |

* cited by examiner

WIRING BOARD AND METHOD FOR MANUFACTURING THE SAME

CROSS-REFERENCE TO RELATED APPLICATIONS

The present application is based upon and claims the benefit of priority to Japanese Patent Application No. 2011-010309 filed Jan. 20, 2011, and Japanese Patent Application No. 2011-155277 filed Jul. 13, 2011. The contents of specifications, scope of patent claims and drawings in Japanese Patent Application Nos. 2011-010309 and 2011-155277 are incorporated herein by reference in their entirety in the present application.

BACKGROUND OF THE INVENTION

1. Field of the Invention

The present invention relates to a wiring board with a built-in capacitor and its manufacturing method.

2. Discussion of the Background

Japanese Laid-Open Patent Publication No. 2007-266197 describes a wiring board which includes a resin substrate having a cavity, and a capacitor formed in the cavity and positioned on a side of the resin substrate. The contents of Japanese Laid-Open Patent Publication No. 2007-266197 are incorporated herein by reference in their entirety in the present application.

SUMMARY OF THE INVENTION

According to one aspect of the present invention, a wiring board includes a core substrate having an opening portion and a through hole adjacent to the opening portion, a capacitor positioned in the opening portion, and a through-hole conductor formed in the core substrate has a first surface and a second surface on the opposite side of the first surface, the opening portion of the core substrate penetrates from the first surface to the second surface, the through-hole conductor has a first conductive portion and a second conductive portion connected to the first conductive portion in the core substrate, the first conductive portion of the through-hole conductor becomes narrower from the first surface of the core substrate toward the second surface of the core substrate, and the second conductive portion of the through-hole conductor becomes narrower from the second surface of the core substrate toward the first surface of the core substrate.

According to another aspect of the present invention, a method for manufacturing a wiring board includes preparing a substrate having a first surface and a second surface on the opposite side of the first surface, forming in the substrate an opening portion penetrating through the substrate, positioning a capacitor in the opening portion of the substrate, forming in the substrate a through hole such that the through hole has a first portion which becomes narrower from the first surface of the substrate toward the second surface of the substrate and a second portion which becomes narrower from the second surface of the substrate toward the first surface of the substrate, and filling a conductor in the through hole such that a through-hole conductor having a first conductive portion and a second conductive portion connected to the first conductive portion in the substrate is formed in the substrate. The opening portion and the through hole are positioned adjacent to each other.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
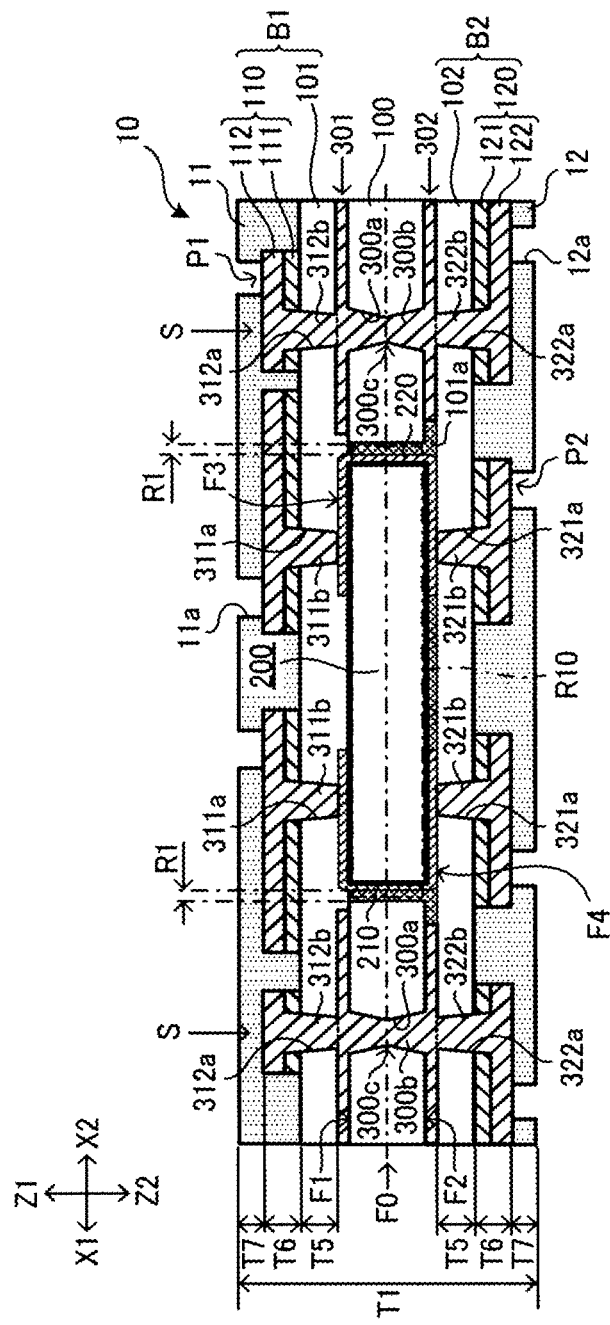
FIG. 1 is a cross-sectional view of a wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction of a wiring board (or a thickness direction of the wiring board) corresponding to a direction along a normal line to main surfaces (upper and lower surfaces) of the wiring board. On the other hand, arrows (X1, X2) and (Y1, Y2) each indicate a direction perpendicular to a lamination direction (or a direction to a side of each layer). Main surfaces of a wiring board are on the X-Y plane, and side surfaces of the wiring board are on the X-Z plane or the Y-Z plane.

Two main surfaces facing opposite directions of a normal line are referred to as a first surface or a third surface (a Z1-side surface) and a second surface or a fourth surface (a Z2-side surface). In lamination directions, the side closer to the core is referred to as a lower layer (or inner-layer side), and the side farther from the core is referred to as an upper layer (or outer-layer side). "Directly on" means in a direction Z (Z1 side or Z2 side). Unless otherwise specified, a planar shape means a shape on the X-Y plane.

A conductive layer is a layer formed with one or multiple conductive patterns. A conductive layer may include a conductive pattern that forms an electrical circuit, such as wiring (including ground), pad, land or the like; or it may include a planar conductive pattern or the like that does not form an electrical circuit.

Opening portions include notches and cuts in addition to holes and grooves. Holes are not limited to penetrating holes, but also include non-penetrating holes. Holes include via holes and through holes. In the following, the conductor formed in a via hole (wall surface or bottom surface) is referred to as a via conductor, and the conductor formed in a through hole (wall surface) is referred to as a through-hole conductor.

Plating includes wet plating such as electrolytic plating as well as dry plating such as PVD (physical vapor deposition) and CVD (chemical vapor deposition).

"Preparing" includes situations in which material and components are purchased and manufactured accordingly as well as situations in which finished products are purchased and used accordingly.

Positioning a capacitor in an opening portion includes completely accommodating the entire capacitor in the opening portion as well as positioning only part of the capacitor in the opening portion.

Unless otherwise specified, the "width" of a hole or a column (protrusion) indicates the diameter if it is a circle, and $2\sqrt{}$ (cross section/$\pi$) if it is other than a circle.

Basically, whether or not an irregular measurement (thickness of a roughened portion, width of a tapered portion, or the like) is in a predetermined range is determined by whether the average value of the measurement (average of effective values only, excluding abnormal values) is within the range. However, such a definition is not applied if other values such as a maximum value are specified to be used instead of an average value.

As shown in FIG. 1, wiring board 10 according to the present embodiment has substrate 100 (insulative substrate), first buildup section (B1), second buildup section (B2), capacitor 200 and solder-resists (11, 12). Wiring board 10 of the present embodiment is a rigid wiring board of a rectangular sheet type. However, wiring board 10 may be a flexible wiring board. In the following, one of upper and lower surfaces (two main surfaces) of substrate 100 is referred to as first surface (F1), and the other as second surface (F2). Also, of the upper and lower surfaces (two main surfaces) of capacitor 200, the surface facing the same direction as first surface (F1) is referred to as third surface (F3), and the other as fourth surface (F4).

First buildup section (B1) is formed on the first-surface (F1) side of substrate 100, and second buildup section (B2) is formed on the second-surface (F2) side of substrate 100. First buildup section (B1) is formed with insulation layer 101 (interlayer insulation layer) and conductive layer 110; and second buildup section (B2) is formed with insulation layer 102 (interlayer insulation layer) and conductive layer 120. Capacitor 200 is built into wiring board 10. Solder resists (11, 12) are formed on first buildup section (B1) and second buildup section (B2) respectively.

Substrate 100 is insulative and becomes the core substrate of wiring board 10. Conductive layer 301 is formed on first surface (F1) of substrate 100, and conductive layer 302 is formed on second surface (F2) of substrate 100. Cavity (R10) is formed in substrate 100. Cavity (R10) corresponds to an opening portion in which capacitor 200 is accommodated. In the present embodiment, cavity (R10) is made of a hole that penetrates through substrate 100.

Capacitor 200 is positioned in a side direction of substrate 100 (direction X or direction Y) by being placed in cavity (R10). In the present embodiment, substantially entire capacitor 200 is completely accommodated in cavity (R10). However, that is not the only option, and only part of capacitor 200 may be positioned in cavity (R10). In the present embodiment, insulator (101a) is filled in clearance (R1) between capacitor 200 in cavity (R10) and substrate 100. In the present embodiment, insulator (101a) is made of insulative material (specifically, resin) that forms upper insulation layer 101 (specifically, resin insulation layer) (see FIG. 19A). Insulator (101a) has a greater thermal expansion coefficient than any of substrate 100 or capacitor 200. Insulator (101a) completely surrounds capacitor 200. In doing so, capacitor 200 is protected by insulator (101a) (resin), while being fixed to a predetermined position.

Insulation layer 101 (first insulation layer) is formed on first surface (F1) of substrate 100 and third surface (F3) of capacitor 200, and insulation layer 102 (second insulation layer) is formed on second surface (F2) of substrate 100 and fourth surface (F4) of capacitor 200. Then, one opening of cavity (R10) (hole) (on the first-surface (F1) side) is covered by insulation layer 101, and the other opening of cavity (R10) (hole) (on the second-surface (F2) side) is covered by insulation layer 102. In the present embodiment, conductive layers (110, 120) are the outermost layers. However, that is not the only option, and more interlayer insulation layers and conductive layers may be further laminated (see later-described FIG. 35).

Conductive layer 110 is the outermost conductive layer on the first-surface (F1) side, and conductive layer 120 is the outermost conductive layer on the second-surface (F2) side. Solder resists (11, 12) are formed respectively on conductive layers (110, 120). However, opening portions (11a, 12a) are respectively formed in solder resists (11, 12). Therefore, a predetermined spot of conductive layer 110 (a portion corresponding to opening portion (11a)) is exposed without being covered by solder resist 11 and becomes pad (P1). Also, a predetermined spot of conductive layer 120 (a portion corresponding to opening portion (12a)) becomes pad (P2). Pad (P1) becomes an external connection terminal for electrical connection with another wiring board, for example, and pad (P2) becomes an external connection terminal for mounting an electronic component, for example (see later-described FIG. 24). However, usage of pads (P1, P2) is not limited to the above, and they may be used in any other way.

In the present embodiment, pads (P1, P2) have an anticorrosion layer made of, for example, Ni/Au film on their surfaces. Such an anticorrosion layer is made by electrolytic plating, sputtering or the like. Also, by conducting an OSP (organic solderability preservative) treatment, an anticorrosion layer made of organic preservative film may be formed. Such an anticorrosion layer is not always required, and may be omitted unless necessary.

Through hole (300a) is formed in substrate 100 (core substrate), and by filling conductor (such as copper plating) in through hole (300a), through-hole conductor (300b) is formed. In the present embodiment, through-hole conductor (300b) is shaped like an hourglass.

Figure 2A:
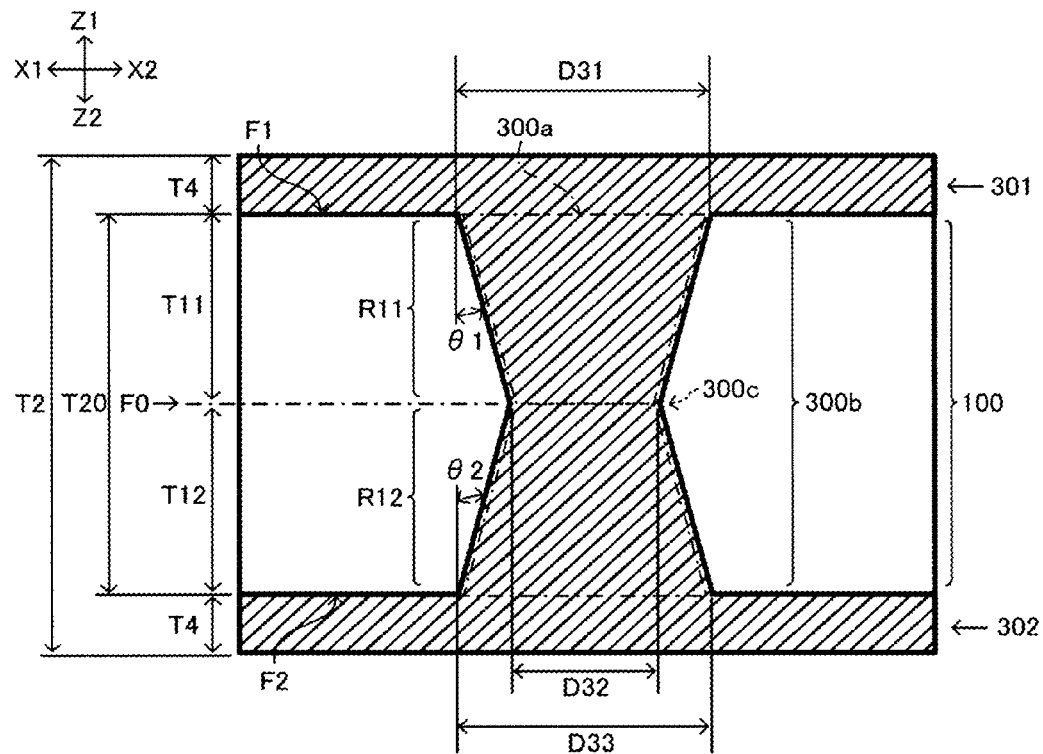
FIG. 2A is a magnified view of a through-hole conductor formed in the core substrate shown in FIG. 1.
Figure 2B:
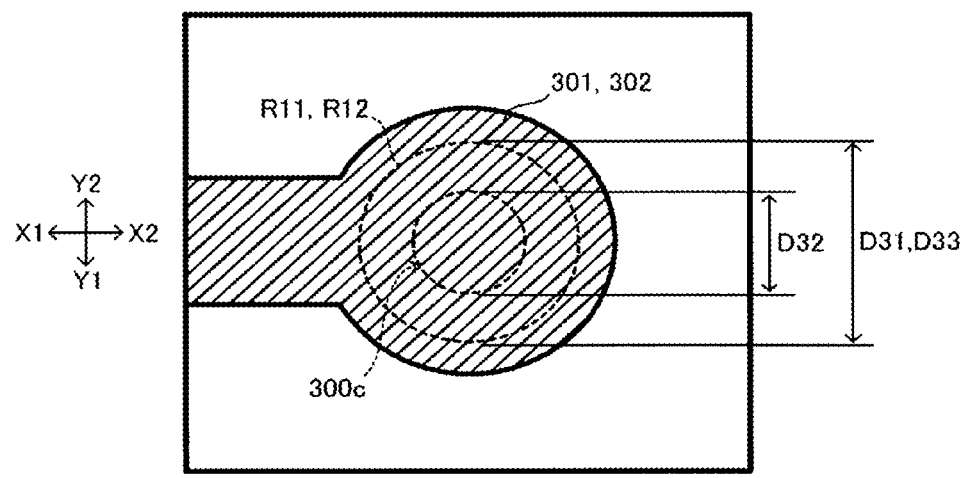
FIG. 2B is a plan view of the through-hole conductor shown in FIG. 2A.

As shown in FIG. 2A, through-hole conductor (300b) of the present embodiment has first conductive portion (R11) whose width increases from base surface (F0) of substrate 100 (core substrate) toward first surface (F1), and second conductive portion (R12) whose width increases from base surface (F0) toward second surface (F2). As shown in FIG. 2B, the planar shapes of first conductive portion (R11) and second conductive portion (R12) are circular, for example. Namely, the shapes of first conductive portion (R11) and second conductive portion (R12) in the present embodiment are each a tapered column (truncated cone) tapering with a width that becomes narrower toward base surface (F0). Through-hole conductor (300b) is formed by directly connecting at base surface (F0) first conductive portion (R11) and second conductive portion (R12). Through-hole conductor (300b) has a narrowed portion (300c) where the width reaches its minimum, and narrowed portion (300c) is positioned at base surface (F0). In the present embodiment, base surface (F0) corresponds to the X-Y plane. As shown in FIG. 2B, a planar shape of narrowed portion (300c) is circular, for example.

In the present embodiment, measurement (T11) from first surface (F1) to base surface (F0) is substantially the same as measurement (T12) from second surface (F2) to base surface (F0). In addition, first conductive portion (R11) becomes gradually narrower as it comes closer from first surface (F1) to narrowed portion (300c) (base surface F0), and second conductive portion (R12) becomes gradually narrower as it comes closer from second surface (F2) to narrowed portion (300c) (base surface F0). Here taper angle (θ1) of first conductive portion (R11) is substantially the same as taper angle (θ2) of second conductive portion (R12). Through-hole conductor (300b) is shaped to be symmetrical at base surface (F0). Here, a taper angle corresponds to the degree at which the width becomes narrower or wider.

In the present embodiment, wall surfaces of through hole (300a) are planar. Accordingly, the taper angle of first conductive portion (R11) and the taper angle of second conductive portion (R12) are each substantially constant. However, the wall surfaces of through hole (300a) are not limited to the above, and may be curved (see FIGS. 25 and 28). Conductive layers (301, 302) each include a land of through-hole conductor (300b).

Following are an example of the preferred value of each measurement of through-hole conductor (300b): width (D31) of an end surface on the first-surface (F1) side is 80 μm, width (D32) of narrowed portion (300c) is 50 μm, and width (D33) of an end surface on the second-surface (F2) side is 80 μm.

Holes (311a, 312a) (each a via hole) are formed in insulation layer 101, and holes (321a, 322a) (each a via hole) are formed in insulation layer 102. Conductor (such as copper plating) is filled in holes (311a, 312a, 321a, 322a), and the conductor in each hole respectively becomes via conductors (311b, 312b, 321b, 322b) (each a filled conductor). In the present embodiment, hole (311a) corresponds to a first via hole, and hole (321a) corresponds to a second via hole.

Holes (311a, 321a) respectively reach electrodes (210, 220) of capacitor 200, and via conductors (311b, 321b) are electrically connected respectively to electrodes (210, 220) of capacitor 200 from the first-surface (F1) side or the second-surface (F2) side of substrate 100. The conductor filled in hole (311a) (first via hole) (via conductor 311b) and the conductor filled in hole (321a) (second via hole) (via conductor 321b) each have a width which becomes narrower toward capacitor 200, and are electrically connected to electrodes of capacitor 200. As described so far, both surfaces of capacitor 200 are connected to via conductors (311b, 321b) in the present embodiment. Hereinafter, such a structure is referred to a double-sided via structure. In the present embodiment, the structure of wiring board 10 becomes almost vertically symmetrical due to its double-sided via structure. Thus, warping of wiring board 10 is suppressed.

Because of the above double-sided via structure, electrodes (210, 220) of capacitor 200 and conductive layer 110 on insulation layer 101 are electrically connected to each other by via conductors (311b), and electrodes (210, 220) of capacitor 200 and conductive layer 120 on insulation layer 102 are also electrically connected to each other by via conductors (321b). In the present embodiment, capacitor 200, via conductor (311b) and via conductor (321b) form a power-source line.

In addition, conductive layer 301 on first surface (F1) of substrate 100 and conductive layer 110 on insulation layer 101 are electrically connected to each other by via conductor (312b), and conductive layer 302 on second surface (F2) of substrate 100 and conductive layer 120 on insulation layer 102 are electrically connected to each other by via conductor (322b). Also, conductive layer 301 on first surface (F1) of substrate 100 and conductive layer 302 on second surface (F2) of substrate 100 are electrically connected to each other by through-hole conductor (300b). Via conductors (312b, 322b) and through-hole conductor (300b) are each a filled conductor, and when they are stacked in a direction Z, filled-stack structure (S) is formed. In the present embodiment, filled-stack structure (S) forms a signal line.

Figure 3:
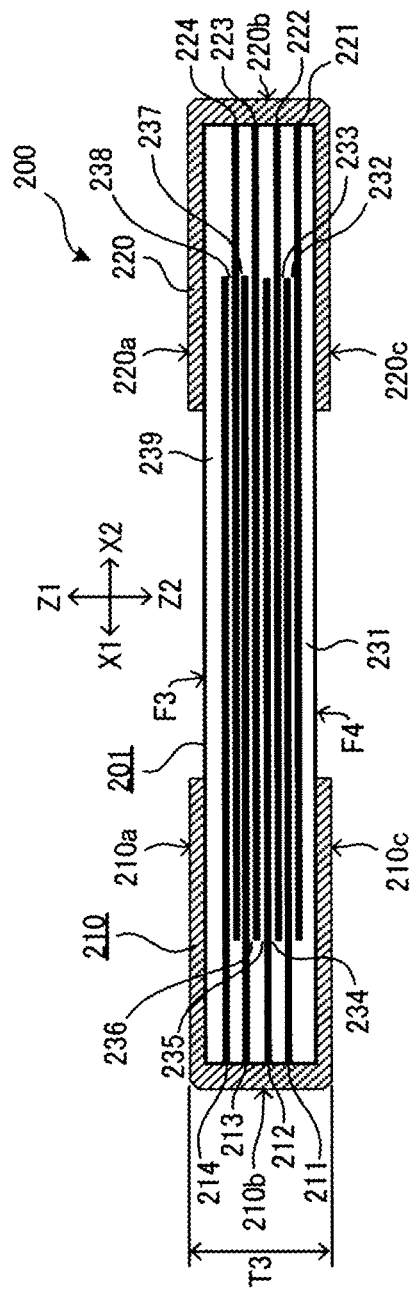
FIG. 3 is a cross-sectional view of a capacitor to be built into a wiring board according to the embodiment of the present invention.

Capacitor 200 is a chip-type MLCC (multilayer ceramic capacitor) as shown in FIG. 3, for example, and has capacitor body 201 and U-shaped electrodes (210, 220). Capacitor body 201 is formed by alternately laminating multiple dielectric layers (231~239) and multiple conductive layers (211~214, 221~224). Dielectric layers (231~239) are made of ceramics, for example. Electrodes (210, 220) are formed on either side of capacitor body 201. Capacitor body 201 is covered by electrodes (210, 220) from the lower surface (a surface on the fourth-surface (F4) side) to a side surface and to the upper surface (a surface on the third-surface (F3) side). In the following, regarding electrode 210, the portion covering the upper surface of capacitor body 201 is referred to as upper portion (210a), the portion covering a side surface of capacitor body 201 as side portion (210b), and the portion covering the lower surface of capacitor body 201 as lower portion (210c). Also, regarding electrode 220, the portion covering the upper surface of capacitor body 201 is referred to as upper portion (220a), the portion covering a side surface of capacitor body 201 as side portion (220b), and the portion covering the lower surface of capacitor body 201 as lower portion (220c). In the present embodiment, side portions (210b, 220b) correspond to their respective side electrodes. Upper portions (210a, 220a) are each electrically connected to via conductor (311b), and lower portions (210c, 220c) are each electrically connected to via conductor (321b). In the present embodiment, surfaces of electrodes (210, 220) of capacitor 200 are not roughened.

Since the central portion of capacitor body 201 positioned between electrode 210 and electrode 220 is not covered by electrodes (210, 220), and dielectric layers (231, 239) (ceramic) are exposed as shown in FIG. 3, the strength is relatively low. However, when capacitor 200 is mounted (built) in wiring board 10, the central portion of capacitor body 201 is covered by insulation layers (101, 102) or insulator (101a). Thus, capacitor body 201 is protected by such insulative materials (resin and the like).

Figure 4:
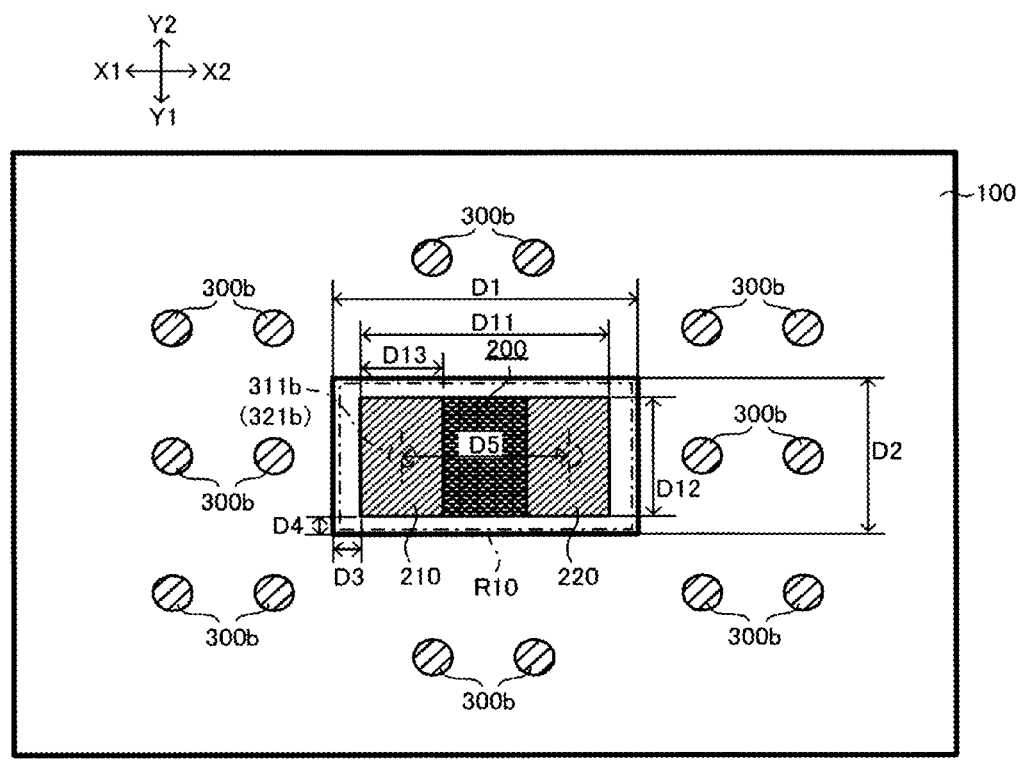
FIG. 4 is a plan view showing the position and shape of a capacitor accommodated in a cavity in the wiring board according to the embodiment of the present invention.

FIG. 4 shows a state in which capacitor 200 is accommodated in cavity (R10) of substrate 100 (core substrate).

Cavity (R10) penetrates through substrate 100. The opening shapes of both ends of cavity (R10) (on the first-surface (F1) side and the second-surface (F2) side) are substantially rectangular. Capacitor 200 is shaped to be a substantially rectangular sheet, for example, and the main surfaces of capacitor 200 are shaped substantially rectangular, for example. In the present embodiment, capacitor 200 has a planar shape corresponding to cavity (R10) (a similar shape with substantially the same size, for example).

Here, an example of the preferred value is shown for each measurement in FIGS. 1~3.

Thickness (T1) of wiring board 10 (FIG. 1), namely, the thickness from solder resist 11 to solder resist 12, is 290 μm. Thickness (T20) of substrate 100 (core substrate) (FIG. 2A) is 106 μm. Thickness (T3) of capacitor 200 (FIG. 3), specifically, the thickness including electrodes (210, 220), is 150 μm. Thicknesses (T4) of conductive layers (301, 302) (FIG. 2A) are each 20 μm. Thicknesses (T5) of insulation layers (101, 102) (FIG. 1) are each 39 μm. Thicknesses (T6) of conductive layers (110, 120) (FIG. 1) are each 18 μm. Thicknesses (T7) of solder resists (11, 12) (FIG. 1) are each 15 μm.

Regarding thickness (T1) of wiring board 10, the sum (T2) (=T20+T4×2) of thicknesses of substrate 100 (core substrate) and conductive layers (301, 302) on both of its surfaces, and thickness (T3) of capacitor 200, it is preferred that T3/T2 be in the range of 0.8 to 1.25 and T3/T1 be in the range of 0.4 to 0.7. With those measurements, warping tends to be suppressed.

Next, an example of the preferred value is shown for each measurement in FIG. 4.

Width (D1) of cavity (R10) in a longitudinal direction is 1080 μm, and width (D2) of cavity (R10) in a lateral direction is 580 μm. Width (D11) of capacitor 200 in a longitudinal direction is 1000 μm, and width (D12) of capacitor 200 in a lateral direction is 500 μm. Width (D3) of the gap between capacitor 200 and cavity (R10) in a longitudinal direction is 40 μm (the clearance is twice as much, 80 μm), and width (D4) of the gap between capacitor 200 and cavity (R10) in a lateral direction is 40 μm (the clearance is twice as much, 80 μm). Width (D13) of upper portion (210a) or lower portion (210c) of electrode 210, or of upper portion (220a) or lower portion (220c) of electrode 220, is 230 μm.

Via conductor (311b) and via conductor (321b) are positioned so that they face each other with capacitor 200 sandwiched in-between, for example. Pitch (D5) of via conductors (311b) or (321b) is 770 μm.

At least either on the upper or lower surface of capacitor 200 (third surface (F3) or fourth surface (F4)), it is preferred that electrodes (210, 220) occupy 40% to 90% of the surface area. Namely, on third surface (F3) of electrode 210, the ratio at which upper portions (210a, 220a) occupy the area is preferred to be in the range of 40% to 90% (hereinafter referred to as ratio (1) of the occupied area). Also, on fourth surface (F4) of electrode 220, the ratio at which lower portions (210c, 220c) occupy the area is preferred to be in the range of 40% to 90% (hereinafter referred to as ratio (2) of the occupied area). If ratio (1) or (2) of the occupied area is 40% or greater, it is easy to align the electrical connection between electrodes (210, 220) and via conductors (311b, 321b) (via connection). In addition, if ratio (1) or (2) of the occupied area is 90% or less, delamination at surfaces of electrodes (210, 220) tends not to occur. Thus, it is easier to omit treatments to suppress delamination such as roughening treatment or the like for the surfaces of electrodes (210, 220). In the present embodiment, ratios (1) and (2) of the occupied areas (%) each correspond to 100×(width (D12)×width (D13)+width (D12)×width (D13))/(width (D11)×width (D12)).

As shown in FIG. 4, for example, multiple through-hole conductors (300b) (and filled stack structure (S)) are positioned around capacitor 200 in the present embodiment. However, positioning and the number of through hole conductors (300b) are not limited specifically. The number of through-hole conductors (300b) may be one or multiple.

Substrate 100 is made of glass cloth (core material) impregnated with epoxy resin (hereinafter referred to as glass epoxy), for example. The core material has a lower thermal expansion coefficient than a main material (epoxy resin in the present embodiment). As for the core material, for example, inorganic material such as glass fiber (glass cloth, glass non-woven fabric or the like), aramid fiber (aramid non-woven fabric or the like), and silica filler is preferable. However, basically, the material for substrate 100 is not limited specifically. For example, instead of epoxy resin, the following may also be used: polyester resin, bismaleimide-triazine resin (BT resin), imide resin (polyimide), phenol resin, allyl polyphenylene ether resin (A-PPE resin) or the like. Substrate 100 may be formed with multiple layers made of different materials.

In the present embodiment, insulation layers (101, 102) are each made by impregnating core material with resin. Insulation layers (101, 102) are made of glass epoxy, for example.

However, insulation layers (101, 102) are not limited to such, and they may also be made of resin without core material, for example. Also, basically, the material for insulation layers (101, 102) may be any type. For example, instead of epoxy resin, the following may also be used: polyester resin, bismaleimide-triazine resin (BT resin), imide resin (polyimide), phenol resin, allyl polyphenylene ether resin (A-PPE resin) or the like. Each insulation layer may be formed with multiple layers made of different materials.

Conductive layer 110 is formed with copper foil 111 (lower layer) and copper plating 112 (upper layer), and conductive layer 120 is formed with copper foil 121 (lower layer) and copper plating 122 (upper layer). Conductive layers (110, 120) have, for example, wiring lines that form electrical circuits (such as electrical circuits including capacitor 200), lands, plain patterns to enhance the strength of wiring board 10, and the like.

Figure 5A:
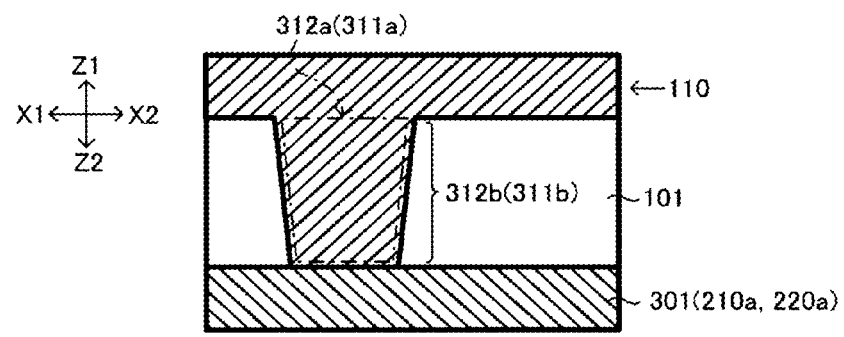
FIG. 5A is a magnified view of a via conductor included in a first buildup section formed on a first-surface side of the core substrate.

As shown in FIG. 1, each width of via conductors (312b) electrically connected to conductive layer 301 becomes narrower toward base surface (F0). Also, each width of via conductors (311b) which are electrically connected to electrodes (210, 220) of capacitor 200 (specifically, upper portions (210a, 220a)) becomes narrower toward base surface (F0) as shown in FIG. 1. In the present embodiment, each shape of via conductors (311b, 312b) is, for example, a tapered column (truncated cone) tapering with a width that increases from conductive layer 301 or electrodes (210, 220) of capacitor 200 toward their upper layer as shown in FIG. 5A. Via conductors (311b, 312b) are each made of copper plating, for example.

Figure 5B:
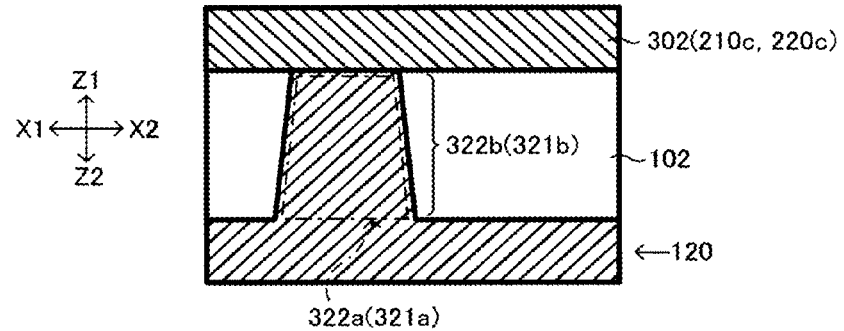
FIG. 5B is a magnified view of a via conductor included in a second buildup section formed on a second-surface side of the core substrate.

Also, as shown in FIG. 1, each width of via conductors (322b) electrically connected to conductive layer 302 becomes narrower toward base surface (F0). In addition, each width of via conductors (321b) electrically connected to electrodes (210, 220) of capacitor 200 (specifically, lower portions (210c, 220c)) becomes narrower toward base surface (F0) as shown in FIG. 1. In the present embodiment, each shape of via conductors (321b, 322b) is, for example, a tapered column (truncated cone) tapering with a width that increases from the conductive pattern of conductive layer 302 or electrodes (210, 220) of capacitor 200 toward their upper layer as shown in FIG. 5B. Via conductors (321b, 322b) are each made of copper plating, for example.

The thermal expansion coefficient of substrate 100 (in directions X, Y) is in the range of 3 ppm to 11 ppm, for example. The thermal expansion coefficient of capacitor 200 is in the range of 10 ppm to 15 ppm, for example. However, when thickness (T20) of substrate 100 (FIG. 2A) is in the range of 0.4 mm to 1.0 mm, the thermal expansion coefficient of substrate 100 (core substrate) is preferred to be lower than that of capacitor 200. In being set so, even if substrate 100 (core substrate) is thin, warping tends to be suppressed.

The material for each conductive layer and each via conductor is not limited specifically as long as it is conductive, and it may be metal or non-metal. Each conductive layer and each via conductor may be formed with multiple layers made of different materials.

Figure 6:
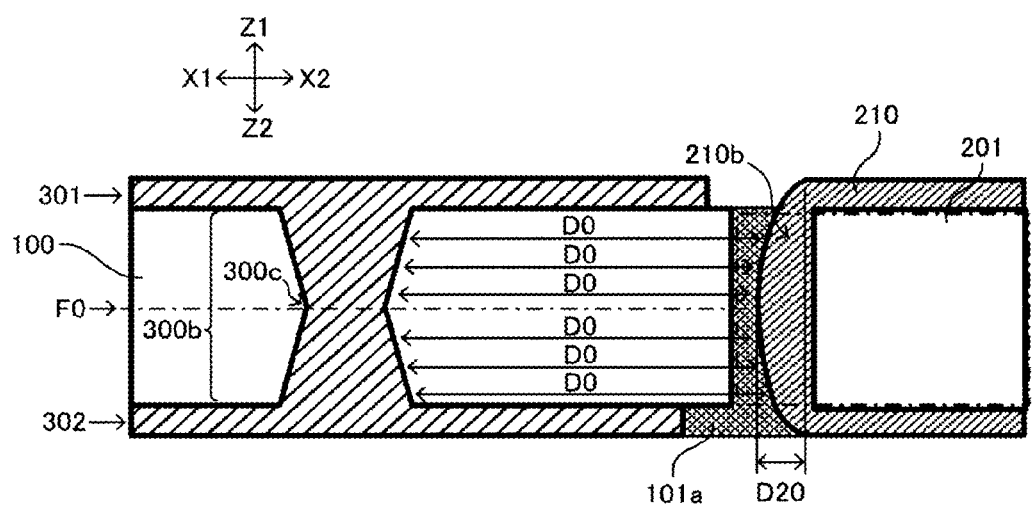
FIG. 6 is a view showing a capacitor having a side electrode which bulges out further in the center in a thickness direction than at both of its ends.

In substrate 100 of the present embodiment, through-hole conductor (300b) is made of first conductive portion (R11) with a width increasing from base surface (F0) in substrate 100 (core substrate) toward first surface (F1) and of second conductive portion (R12) with a width increasing from base surface (F0) toward second surface (F2) (see FIG. 2A). Accordingly, when the center of side portion (210b) of electrode 210 (side electrode) in a thickness direction (direction Z) of capacitor 200 bulges out further than both of its ends as shown in FIG. 6, for example, distance (D0) between through-hole conductor (300b) and capacitor 200 (specifically, the surface of side portion (210b)) tends to be substantially constant in a thickness direction of capacitor 200. Accordingly, since the contraction amount caused by thermal stress becomes substantially constant between through-hole conductor (300b) and capacitor 200 in a thickness direction of capacitor 200, distortion seldom occurs in wiring board 10. As a result, warping of wiring board 10 is suppressed. If warping of wiring board 10 is suppressed, delamination on the surfaces of electrodes (210, 220) of capacitor 200, cracking at each electrical connection point, cracks in capacitor 200 or the like seldom occur. As a result, electrical connection reliability is enhanced in wiring board 10. In addition, with constant distance (D0), insulation reliability tends to be secured between through-hole conductor (300b) and capacitor 200. As a result, through-hole conductor (300b) and capacitor 200 can be positioned closer to each other, allowing positioning of through-hole conductor (300b) near capacitor 200. Distance (D0) between through-hole conductor (300b) and capacitor 200 is preferred to be in the range of 150 µm to 500 µm. If distance (D0) is in such a range, miniaturization of wiring board 10 is easier to achieve, while securing insulation reliability between through-hole conductor (300b) and capacitor 200. Distance (D0) is 200 µm in an especially preferred example.

In the example shown in FIG. 6, the center of a side electrode (side portion 210b) bulges out further than at both of its ends by measurement (D20).

In the present embodiment, each width of all via conductors (via conductors 311b and 312b) formed in insulation layer 101 (first insulation layer) becomes narrower toward base surface (F0), and each width of all via conductors (via conductors 321b and 322b) formed in insulation layer 102 (second insulation layer) becomes narrower toward base surface (F0). Accordingly, stress or the like tends to be concentrated on base surface (F0) of substrate 100 (core substrate), and stress distribution on the X-Y plane is thought to become constant. As a result, warping of wiring board 10 is suppressed and electrical connection reliability is enhanced in wiring board 10.

Via conductors in wiring board 10 have a symmetrical structure at base surface (F0). Specifically, via conductors positioned on the first-surface (F1) side of base surface (F0) (via conductors 311b and 312b) and via conductors positioned on the second-surface (F2) side of base surface (F0) (via conductors 321b and 322b) have positions and shapes symmetrical to each other (see FIG. 1). Accordingly, stress tends to be offset on both sides of base surface (F0). As a result, warping of wiring board 10 is suppressed and electrical connection reliability is enhanced in wiring board 10.

When thermal expansion and thermal contraction are not balanced between portions vertically sandwiching base surface (F0) in wiring board 10 (Z1 side and Z2 side), it is thought that warping tends to occur in wiring board 10. However, since highly rigid capacitor 200 (such as an MLCC) and through-hole conductor (300b) are positioned near base surface (F0) in the present embodiment, warping seldom occurs in wiring board 10 even in the above situation. Namely, since the rigidity of capacitor 200 is high, warping is suppressed in the region where capacitor 200 is present. In addition, even in a region without capacitor 200, because of through-hole conductor (300b) with high rigidity and having a width that widens as it goes away from base surface (F0), thermal stress tends not to travel from base surface (F0) toward the outside without eventually spreading in the entire substrate 100. As a result, warping is suppressed in wiring board 10.

Figure 7:
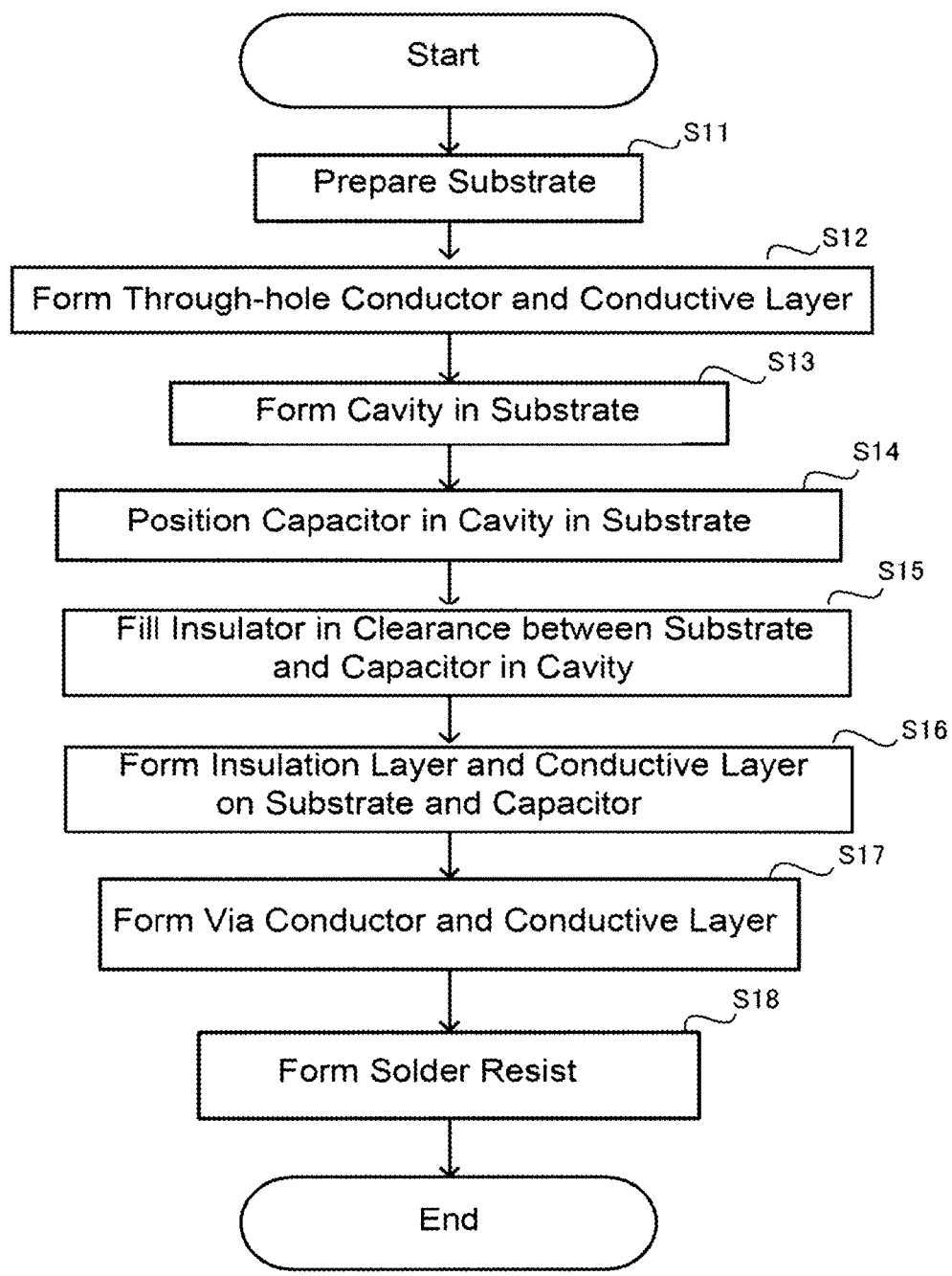
FIG. 7 is a flowchart showing a method for manufacturing a wiring board according to the embodiment of the present invention.

In the following, a method for manufacturing wiring board 10 is described with reference to FIG. 7 and others. FIG. 7 is a flowchart roughly showing the contents and steps of a method for manufacturing wiring board 10 according to the present embodiment.

Figure 8:
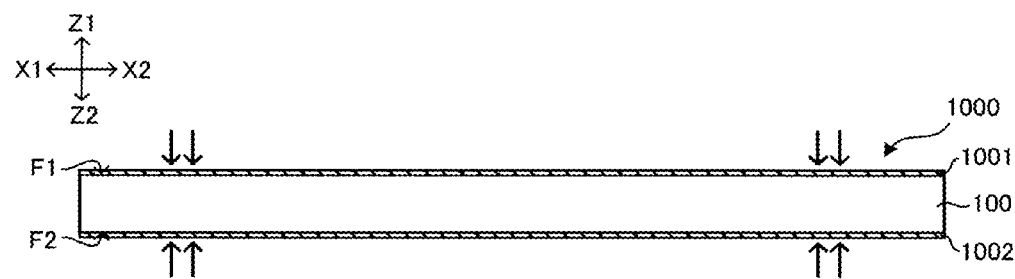
FIG. 8 is a view to illustrate a step for preparing a substrate (core substrate) in the manufacturing method shown in FIG. 7.

In step (S11), double-sided copper-clad laminate 1000 is prepared as a starting material as shown in FIG. 8. Double-sided copper-clad laminate 1000 has substrate 100 (core substrate), copper foil 1001 formed on first surface (F1) of substrate 100, and copper foil 1002 formed on second surface (F2) of substrate 100. In the present embodiment, substrate 100 is made of glass epoxy completely cured at this stage.

Next, in step (S12) in FIG. 7, through-hole conductor (300b) and conductive layers (301, 302) are formed.

Figure 9:
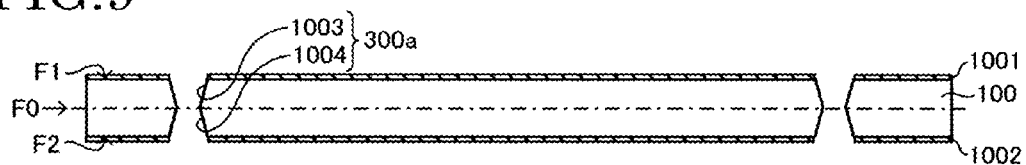
FIG. 9 is a view to illustrate a first step for forming through-hole conductors in a substrate and conductive layers on the substrate.

Specifically, as shown in FIG. 9, a $CO_2$ laser, for example, is used to irradiate double-sided copper-clad laminate 1000 from the first-surface (F1) side to form hole 1003, and to irradiate double-sided copper-clad laminate 1000 from the second-surface (F2) side to form hole 1004. The shape of hole 1003 corresponds to that of first conductive portion (R11) (see FIGS. 2A and 2B), and the shape of hole 1004 corresponds to that of second conductive portion (R12) (see FIGS. 2A and 2B). Holes (1003, 1004) are formed at substantially the same location on the X-Y plane, and they are ultimately connected to form through hole (300a) which penetrates through double-sided copper-clad laminate 1000. The shape of through hole (300a) is like an hourglass, corresponding to through-hole conductor (300b) (see FIGS. 2A and 2B). The boundary of hole 1003 and hole 1004 corresponds to narrowed portion (300c) (see FIGS. 2A and 2B). Laser irradiation at the first surface (F1) and laser irradiation at the second surface (F2) may be conducted simultaneously or one surface at a time. After through hole (300a) is formed, desmearing on through hole (300a) is preferred to be conducted. Unwanted conduction (short circuiting) is suppressed by desmearing. In addition, to improve the absorption efficiency of laser light, black-oxide treatment may be conducted on surfaces of copper foils (1001, 1002) prior to laser irradiation. Instead of using a laser, through hole (300a) may be formed using a drill, etching or the like. However, fine processing is made easier by processing with a laser. Especially, since it is difficult to use a drill when the thermal expansion coefficient of substrate 100 is low, laser processing is effective.

Figure 10:
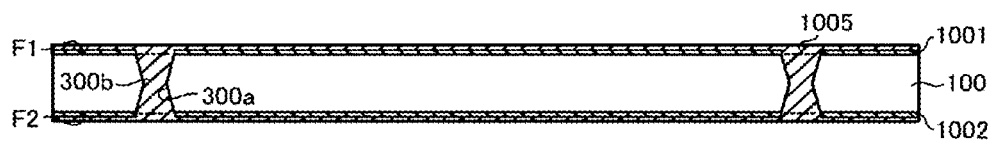
FIG. 10 is a view to illustrate a second step subsequent to the step in FIG. 9.

Next, using a panel plating method, for example, copper plating 1005, for example, is formed on copper foils (1001, 1002) and in through hole (300a) as shown in FIG. 10. Specifically, electroless plating is first performed, followed by electrolytic plating with the electroless plated film as a seed layer using a plating solution to form plating 1005. Accordingly, plating 1005 is filled in through hole (300a), and through-hole conductor (300b) is formed.

Figure 11:
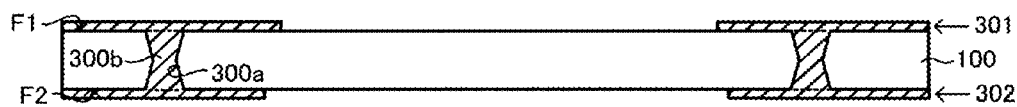
FIG. 11 is a view to illustrate a third step subsequent to the step in FIG. 10.

Next, using etching resist and an etching solution, for example, each conductive layer formed on first surface (F1) and second surface (F2) of substrate 100 is patterned. Specifically, each conductive layer is covered by etching resist with a pattern corresponding to conductive layer 301 or 302, and portions of each conductive layer not covered by etching resist (portions exposed through opening portions of etching resist) are etched away. In doing so, conductive layers (301, 302) are respectively formed on first surface (F1) and second surface (F2) of substrate 100 as shown in FIG. 11. Etching is not limited to a wet type, and a dry type may also be employed.

Figure 12A:
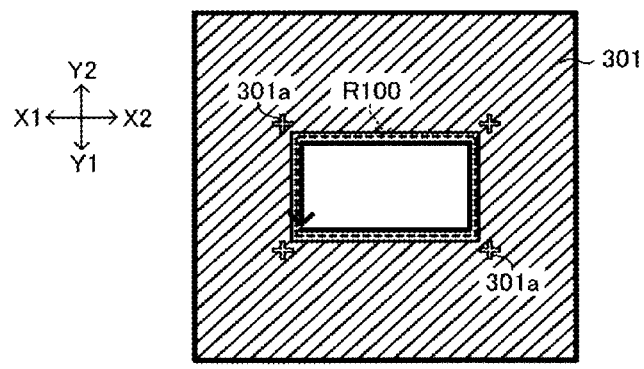
FIG. 12A is a view showing a first example of the shape of a conductive layer formed by the steps shown in FIGS. 9~11.

In the present embodiment, conductive layer 301 is not formed on substrate 100 in region (R100) corresponding to cavity (R10) as shown in FIG. 12A. If conductive layer 301 has such a conductive pattern, since the position and the shape of cavity (R10) are clear, aligning laser irradiation is easier when forming cavity (R10) in a later step (step (S13) in FIG. 7).

Figure 12B:
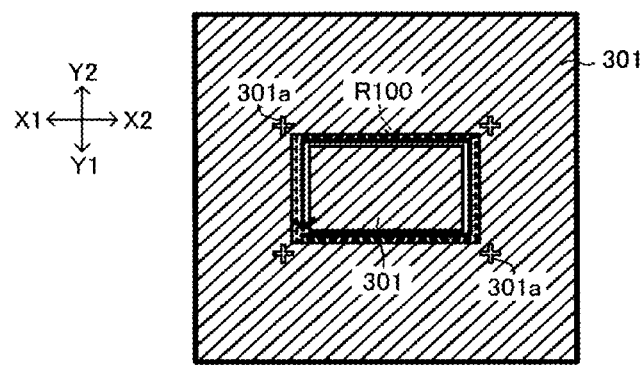
FIG. 12B is a view showing a second example of the shape of a conductive layer formed by the steps shown in FIGS. 9~11.

However, the conductive pattern of conductive layer 301 is not limited to the pattern shown in FIG. 12A. For example, as shown in FIG. 12B, it is an option to remove conductive layer 301 only from the portion on substrate 100 to be irradiated by a laser (hereinafter referred to as a laser irradiation path) in a later step (step (S13) in FIG. 7). In such a case, conductive layer 301 exists inside the laser irradiation path. When conductive layer 301 is formed as above, aligning laser irradiation is also easier when forming cavity (R10).

Also, as shown in FIG. 12A, conductive layer 301 has alignment marks (301a) in the present embodiment. Alignment mark (301a) is a pattern optically recognizable in a later step (step (S14) in FIG. 7), for example, and is formed by partially removing the conductor through etching or the like, for example. In the present embodiment, alignment marks (301a) are arranged around region (R100) (four corners, for example). However, that is not the only option. Positioning and the shape of alignment marks (301a) are not limited specifically.

Figure 13:
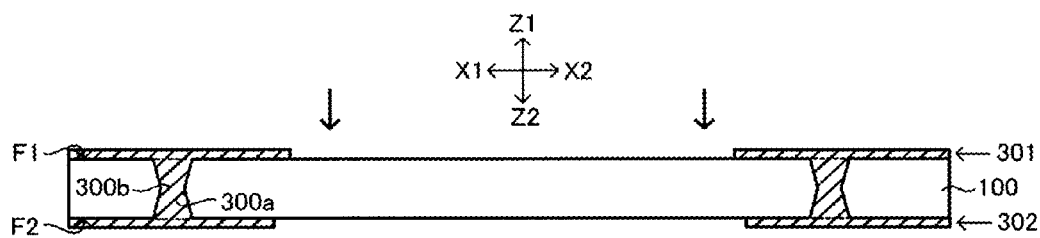
FIG. 13 is a view to illustrate a step for forming a cavity in the manufacturing method shown in FIG. 7.
Figure 14:
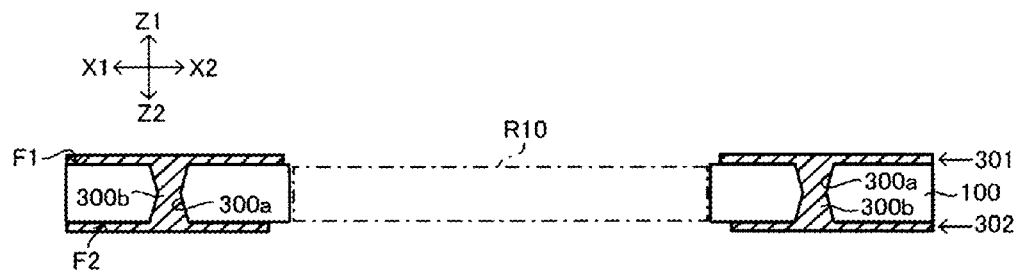
FIG. 14 is a view showing a substrate after the cavity is formed in the manufacturing method shown in FIG. 7.

Next, in step (S13) in FIG. 7, cavity (R10) is formed in substrate 100 (core substrate). In the present embodiment, a laser is irradiated at substrate 100 to form cavity (R10) as shown in FIG. 13. Specifically, as shown in FIG. 12A, for example, a laser is irradiated to draw a rectangle so that region (R100) of substrate 100 corresponding to cavity (R10) is cut off from its surrounding portion. The laser irradiation angle is set substantially perpendicular to first surface (F1) of substrate 100, for example. Accordingly, cavity (R10) is formed as shown in FIG. 14. Since cavity (R10) is formed by a laser, it is easy to form cavity (R10) in the present embodiment. Cavity (R10) becomes an accommodation space for capacitor 200.

Next, in step (S14) in FIG. 7, capacitor 200 is positioned in cavity (R10) in substrate 100.

Figure 15:
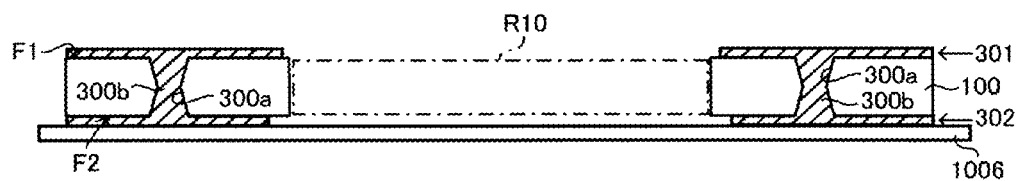
FIG. 15 is a view to illustrate a step for attaching the substrate having the cavity to a carrier in the manufacturing method shown in FIG. 7.

Specifically, carrier 1006 made of PET (polyethylene terephthalate), for example, is arranged on one side of substrate 100 (second surface (F2), for example) as shown in FIG. 15. Accordingly, one opening of cavity (R10) (hole) is covered by carrier 1006. In the present embodiment, carrier 1006 is made of an adhesive sheet (such as a tape), and its adhesive side faces substrate 100. Carrier 1006 is adhered to substrate 100 by lamination, for example.

Figure 16:
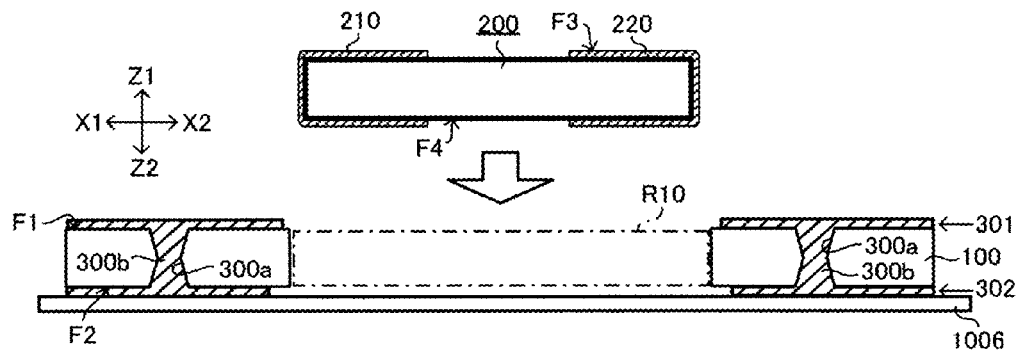
FIG. 16 is a view to illustrate a step for positioning a capacitor in the cavity in the manufacturing method shown in FIG. 7.
Figure 17:
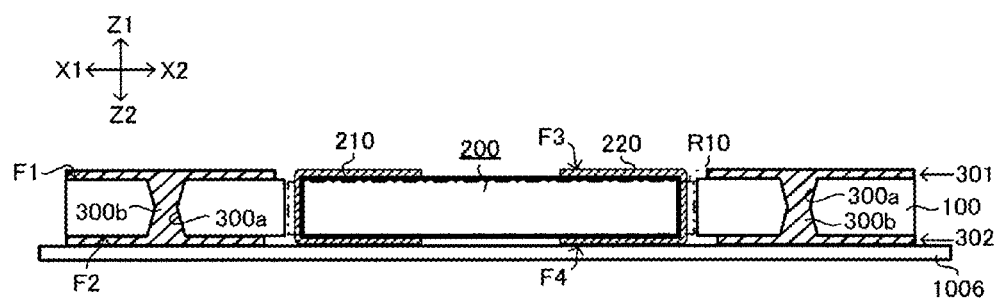
FIG. 17 is a view showing a state in which a capacitor is positioned in the cavity in the manufacturing method shown in FIG. 7.

Next, capacitor 200 is placed into cavity (R10) from the opening (Z1 side) opposite the covered opening of cavity (R10) (hole) as shown in FIG. 16. Capacitor 200 is put into cavity (R10) using a component mounter, for example. For example, capacitor 200 is held on a vacuum chuck or the like, transported to the area above cavity (R10) (Z1 side), lowered vertically from that area, and put into cavity (R10). Accordingly, capacitor 200 is positioned on carrier 1006 (adhesive sheet) as shown in FIG. 17. When determining the position of capacitor 200, alignment marks (301a) (see FIGS. 12A, 12B) are preferred to be used. In doing so, the alignment accuracy of capacitor 200 and cavity (R10) is enhanced.

Surfaces of electrodes (210, 220) of capacitor 200 and conductive layers (301, 302) are not roughened in the present embodiment. However, they may be roughened by etching or the like depending on requirements.

Figure 18:
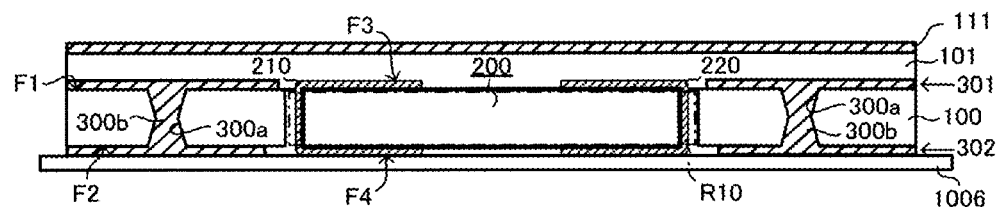
FIG. 18 is a view to illustrate a step for forming a first interlayer insulation layer and a first copper foil on the insulative substrate and on the capacitor in the manufacturing method shown in FIG. 7.
Figure 19A:
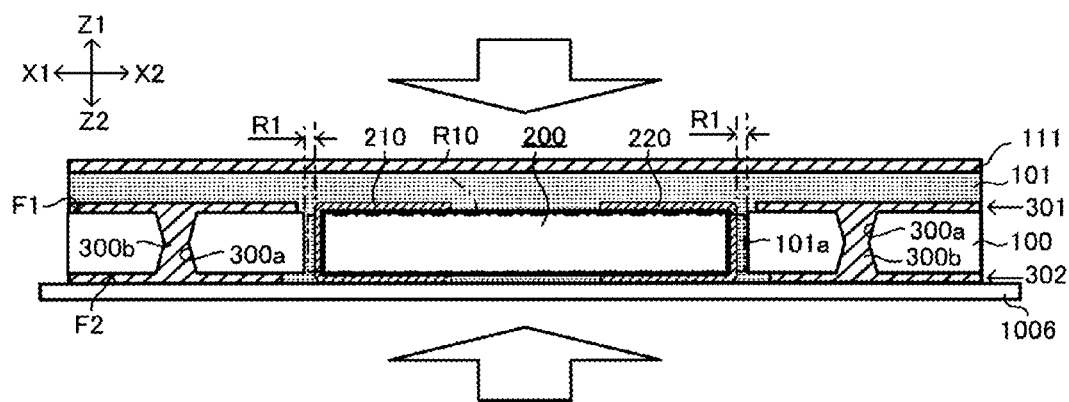
FIG. 19A is a view to illustrate a pressing step in the manufacturing method shown in FIG. 7.
Figure 19B:
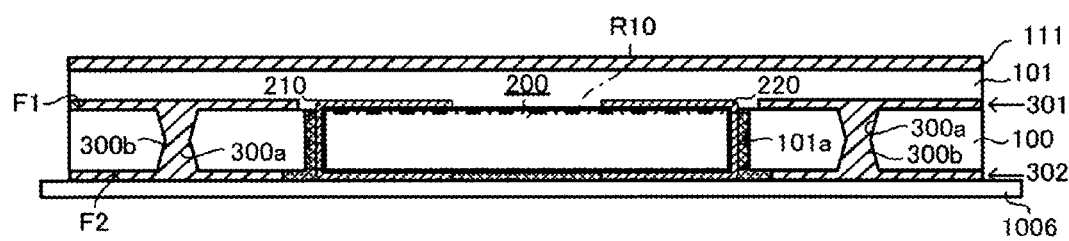
FIG. 19B is a view showing a state after the pressing in FIG. 19A.

Next, in step (S15) in FIG. 7, semicured insulation layer 101 (first interlayer insulation layer) is placed on first surface (F1) of substrate 100 and on third surface (F3) of capacitor 200, which is the opposite side (Z1 side) to the covered opening of cavity (R10) (hole), as shown in FIG. 18. Furthermore, copper foil 111 (first copper foil) is placed on insulation layer 101. Insulation layer 101 is made of glass-epoxy prepreg, for example. Then, as shown in FIG. 19A, resin is flowed from insulation layer 101 to cavity (R10) by pressing semicured insulation layer 101. Accordingly, insulator (101a) (resin of insulation layer 101) is filled in clearance (R1) between substrate 100 and capacitor 200 in cavity (R10) as shown in FIG. 19B. During that time, if the clearance is narrow between substrate 100 and capacitor 200, the intensity of resin flowing into cavity (R10) seldom causes positional shifting or unwanted inclining of capacitor 200 even if capacitor 200 is not securely fixed. Here, insulator (101a) has a greater thermal expansion coefficient than any of substrate 100 or capacitor 200.

After insulator (101a) is filled in cavity (R10), the filled resin (insulator 101a) and capacitor 200 are preliminarily adhered. Specifically, the filled resin is heated to gain retention power to a degree that it can support capacitor 200. In doing so, capacitor 200 supported by carrier 1006 is supported by the filled resin. Then, carrier 1006 is removed.

At this stage, insulator (101a) (filled resin) and insulation layer 101 are only semicured, not completely cured. However, that is not the only option, and insulator (101a) and insulation layer 101 may be completely cured at this stage, for example.

Next, in step (S16) in FIG. 7, a buildup section is formed on the second-surface (F2) side of substrate 100.

Figure 20:
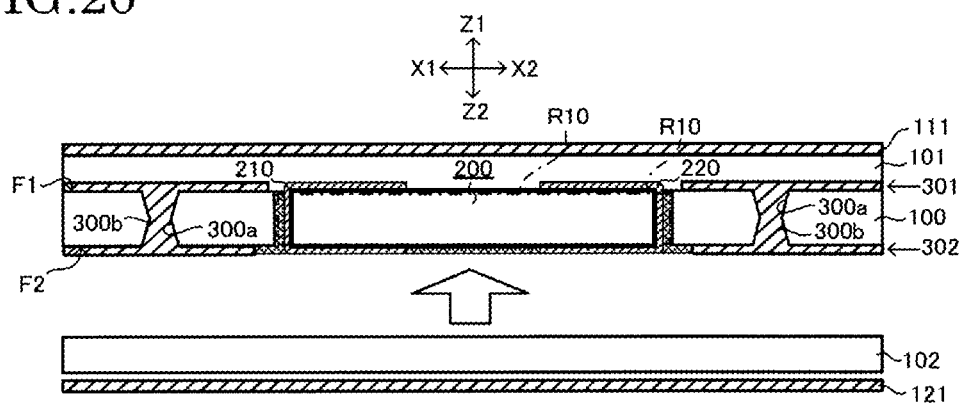
FIG. 20 is a view, in the manufacturing method shown in FIG. 7, to illustrate a step for forming a second interlayer insulation layer and a second copper foil on the insulative substrate and on the capacitor after the carrier is removed.

Specifically, insulation layer 102 (second interlayer insulation layer) and copper foil 121 (second copper foil) are positioned on second surface (F2) of substrate 100 as shown in FIG. 20. Insulation layer 102 is made of glass-epoxy prepreg, for example. Then, semicured insulation layer 102 is adhered to substrate 100 and capacitor 200 by pressing, for example, and insulation layers (101, 102) are each thermally cured. In the present embodiment, since the resin filled in cavity (R10) is cured after adhesive sheet (carrier 1006) is removed, insulation layers (101, 102) can be simultaneously cured. By curing insulation layers (101, 102) on both surfaces simultaneously, warping in substrate 100 is suppressed, and it is easier to make thinner substrate 100.

In the subsequent step (S17) in FIG. 7, via conductors and conductive layers are formed.

Figure 21:
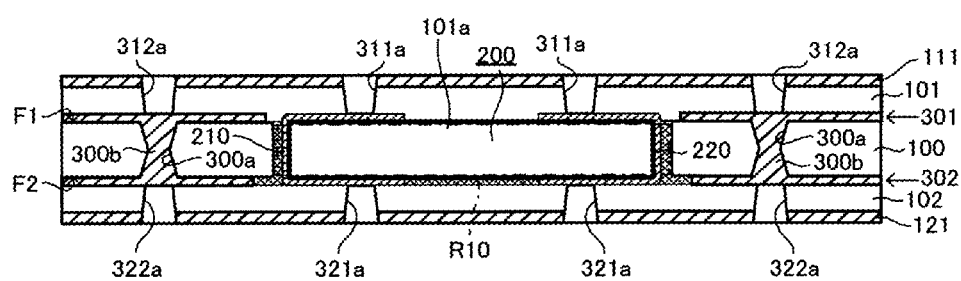
FIG. 21 is a view, in the manufacturing method shown in FIG. 7, to illustrate a first step for forming conductive layers on the first and second interlayer insulation layers and for electrically connecting conductive patterns of each conductive layer to electrodes of the capacitor.

In particular, by using a laser, for example, holes (311a, 312a) (each a via hole) are formed in insulation layer 101 and copper foil 111, and holes (321a, 322a) (each a via hole) are formed in insulation layer 102 and copper foil 121, as shown in FIG. 21. Holes (311a, 312a) each penetrate through insulation layer 101 and copper foil 111, and holes (321a, 322a) each penetrate through insulation layer 102 and copper foil 121. Then, holes (311a, 321a) each reach electrode 210 or 220 of capacitor 200, and holes (312a, 322a) each reach a spot directly on through-hole conductor (300b). Then, desmearing is conducted depending on requirements.

Figure 22A:
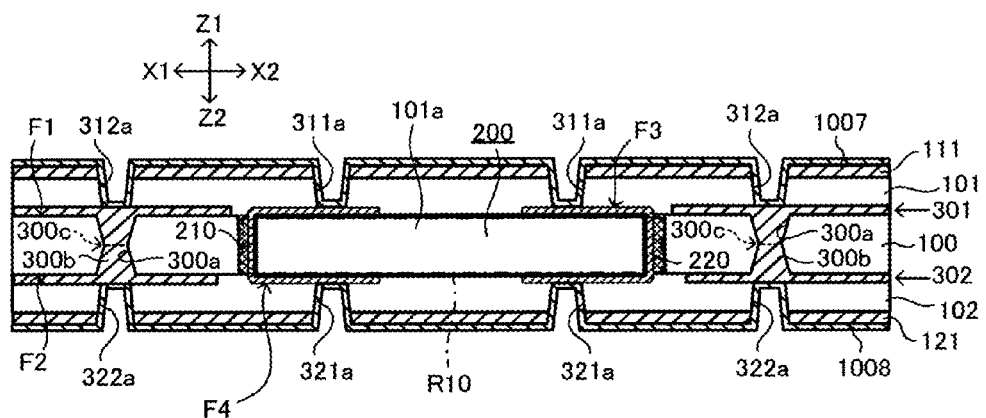
FIG. 22A is a view to illustrate a second step subsequent to the step in FIG. 21.

Next, as shown in FIG. 22A, using a chemical plating method, for example, electroless copper-plated films (1007, 1008), for example, are formed on copper foils (111, 121) and in holes (311a, 312a, 321a, 322a). Prior to electroless plating, a catalyst made of palladium or the like may be adsorbed on surfaces of insulation layers (101, 102) by immersion, for example.

Figure 22B:
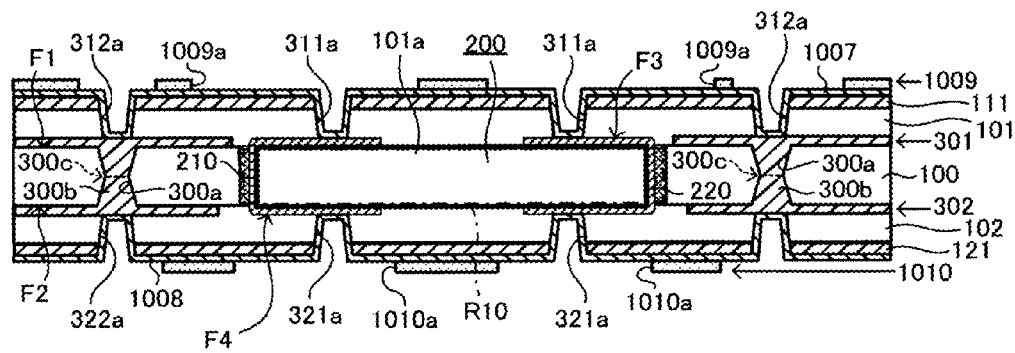
FIG. 22B is a view to illustrate a third step subsequent to the step in FIG. 22A.

Next, as shown in FIG. 22B, by lithographic technique, printing or the like, plating resist 1009 having opening portions (1009a) is formed on the first-surface (F1) side main surface (on electroless plated film 1007), and plating resist 1010 having opening portions (1010a) is formed on the second-surface (F2) side main surface (on electroless plated film

1008). Opening portions (1009a, 1010a) have patterns respectively corresponding to conductive layers (110, 120) (FIG. 1).

Figure 22C:
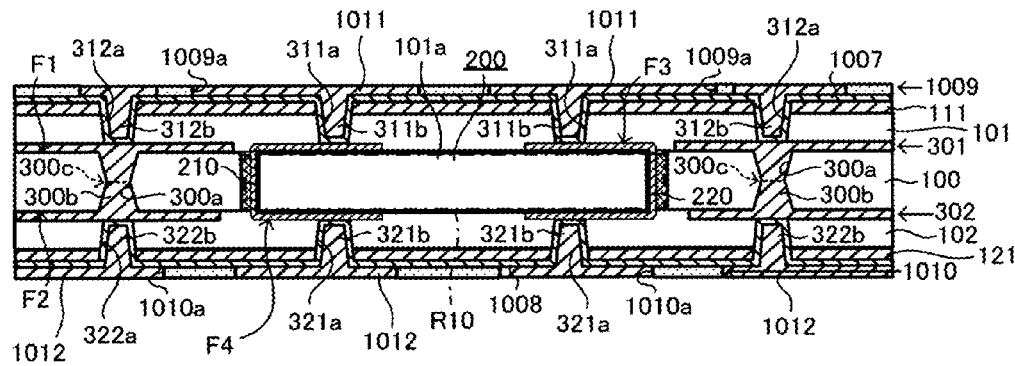
FIG. 22C is a view to illustrate a fourth step subsequent to the step in FIG. 22B.

Next, as shown in FIG. 22C, using a pattern plating method, for example, electrolytic copper platings (1011, 1012), for example, are formed respectively in opening portions (1009a, 1010a) of plating resists (1009, 1010). Specifically, copper as plating material is connected to the anode, and electroless plated films (1007, 1008) as material to be plated are connected to the cathode, and then the substrate is immersed in a plating solution. Then, DC voltage is applied between both poles to flow current so that copper is deposited on surfaces of electroless plated films (1007, 1008). Accordingly, electrolytic platings (1011, 1012) are respectively filled in holes (311a, 312a) and holes (321a, 322a) to form via conductors (311b, 312b, 321b, 322b) made of copper plating, for example.

Figure 23:
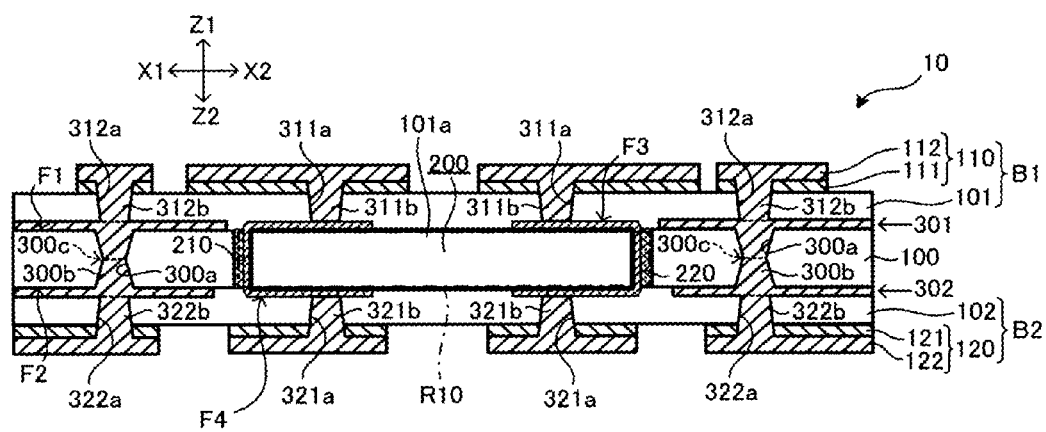
FIG. 23 is a view to illustrate a fifth step subsequent to the step in FIG. 22C.

Then, plating resists (1009, 1010) are removed by a predetermined removing solution, for example, and unnecessary electroless plated films (1007, 1008) and copper foils (111, 121) are removed. Accordingly, conductive layers (110, 120) are formed as shown in FIG. 23.

A seed layer for electrolytic plating is not limited to electroless plated film, and sputtered film or the like may be used as a seed layer instead of electroless plated films (1007, 1008).

Next, in step (S18) in FIG. 7, solder resist 11 having opening portion (11a) and solder resist 12 having opening portion (12a) are respectively formed on insulation layers (101, 102) (see FIG. 1). Conductive layers (110, 120) are respectively covered by solder resists (11, 12) except for predetermined portions (such as pads (P1, P2), lands and the like) corresponding to opening portions (11a, 12a). Solder resists (11, 12) are formed, for example, by screen printing, spray coating, roll coating, lamination or the like.

Next, by electrolytic plating, sputtering or the like, anticorrosion layers made of Ni/Au film, for example, are formed respectively on conductive layers (110, 120), specifically on surfaces of pads (P1, P2) which are not covered by solder resists (11, 12) (see FIG. 1). Alternatively, anticorrosion layers made of organic protective film may also be formed by an OSP treatment.

Accordingly, first buildup section (B1) made up of insulation layer 101 and conductive layer 110 is formed on first surface (F1) of substrate 100, and second buildup section (B2) made up of insulation layer 102 and conductive layer 120 is formed on second surface (F2) of substrate 100. As a result, wiring board 10 of the present embodiment is completed (FIG. 1). Then, electrical testing is performed on capacitor 200 (checking its capacity, insulation and the like) according to requirements.

The manufacturing method of the present embodiment is suitable for manufacturing wiring board 10. Using such a manufacturing method, an excellent wiring board 10 is obtained at low cost.

Figure 24:
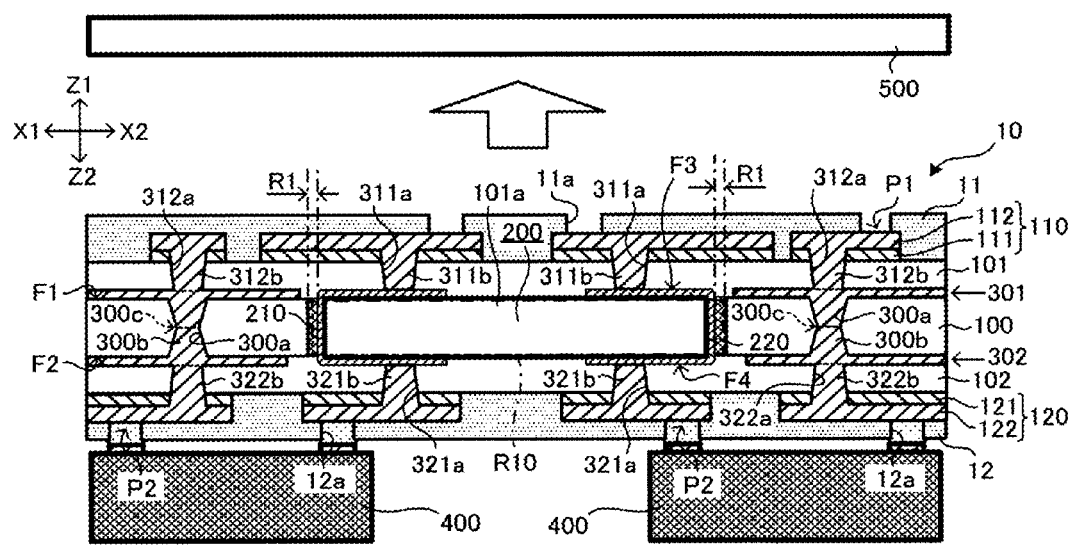
FIG. 24 is a view showing a state in which an electronic component is mounted on a surface of a wiring board according to the embodiment of the present invention.

Wiring board 10 of the present embodiment may be electrically connected to other electronic components or other wiring boards, for example. Electronic component 400 (such as an IC chip) may be mounted on pad (P2) of wiring board 10 using solder or the like as shown in FIG. 24, for example. Also, wiring board 10 may be mounted on another wiring board 500 (such as a motherboard) through pad (P1). Wiring board 10 of the present embodiment may be used as a circuit board of a cell phone, for example.

The present invention is not limited to the above embodiment. For example, the present invention may be modified as follows.

Figure 25:
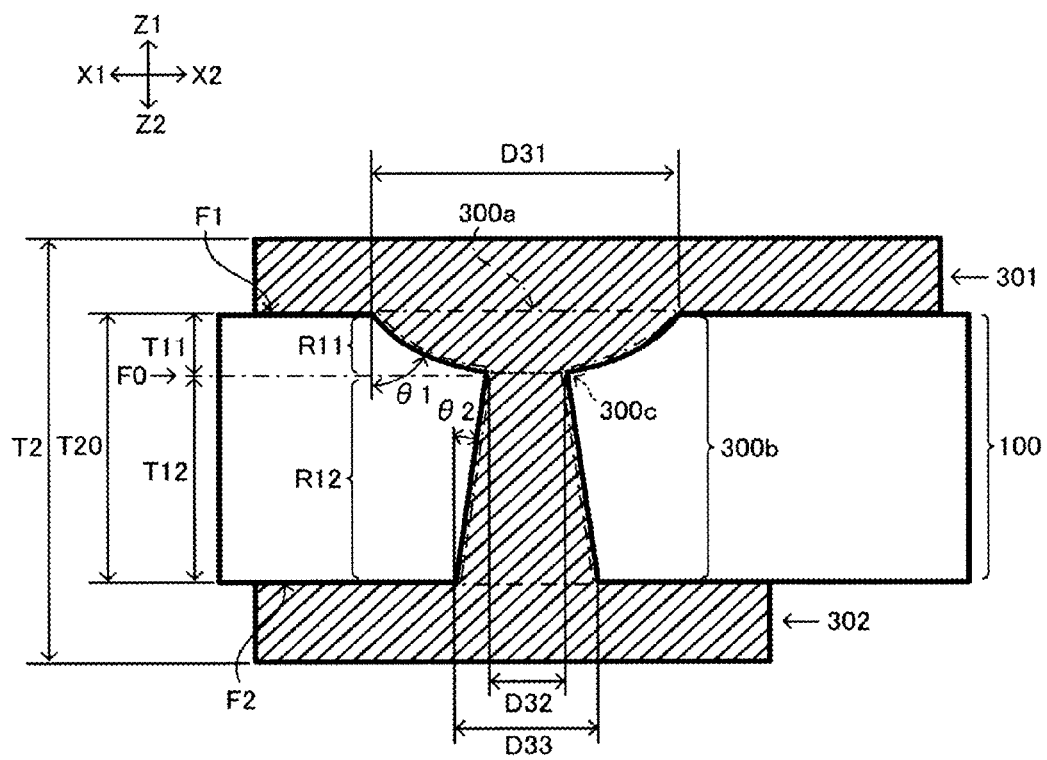
FIG. 25 is a view showing a first alternative example of a through-hole conductor in another embodiment of the present invention.

In the above embodiment, through-hole conductor (300b) has a symmetrical shape at base surface (F0). However, the shape of through-hole conductor (300b) is not limited to such. Through-hole conductor (300b) may have a shape asymmetrical at base surface (F0) as shown in FIG. 25. In the example shown in FIG. 25, measurement (T12) from second surface (F2) to base surface (F0) is greater than measurement (T11) from first surface (F1) to base surface (F0). Also, regarding measurements of through-hole conductor (300b), width (D31) of an end surface on the first-surface (F1) side, width (D32) of narrowed portion (300c) and width (D33) of an end surface on the second-surface (F2) side are, from widest to narrowest, (D31), width (D33) and width (D32). Side surfaces of first conductive portion (R11) are curved, and side surfaces of second conductive portion (R12) are planar. Taper angle ($\theta 1$) of first conductive portion (R11) is greater than taper angle ($\theta 2$) of second conductive portion (R12).

In the following, an example of the method for manufacturing through-hole conductor (300b) shown in FIG. 25 is described with reference to FIGS. 26A~27B.

Figure 26A:
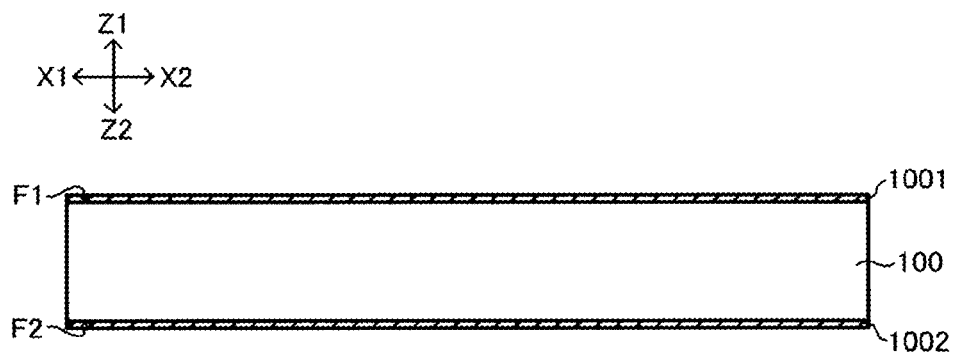
FIG. 26A is a view to illustrate a first step in an example of the method for manufacturing the through-hole conductor shown in FIG. 25.

First, as shown in FIG. 26A, double-sided copper-clad laminate 1000 is prepared, the same as in the above embodiment (see step (S11) in FIG. 7).

Figure 26B:
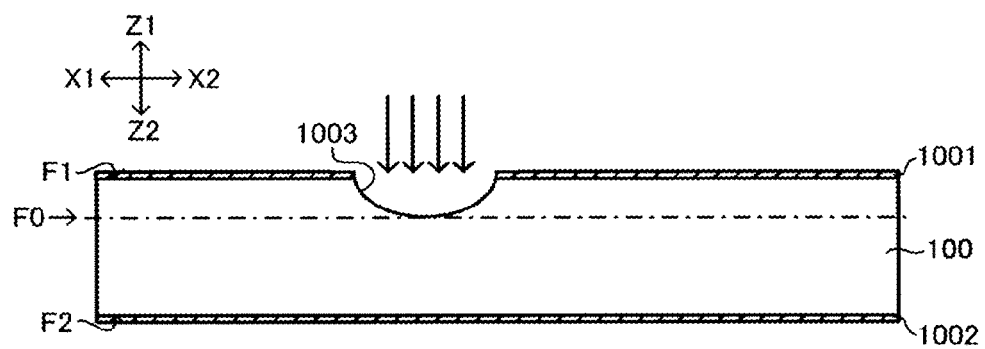
FIG. 26B is a view to illustrate a second step subsequent to the step in FIG. 26A.

Then, as shown in FIG. 26B, using a $CO_2$ laser, for example, hole 1003 is formed by irradiating the laser from the first-surface (F1) side on double-sided copper-clad laminate 1000. Hole 1003 has a bottom, and the shape of hole 1003 is semispherical, tapering with a width that, for example, becomes narrower the deeper it goes. The shape of hole 1003 corresponds to that of first conductive portion (R11) (see FIG. 25). Namely, wall surfaces of hole 1003 are curved.

Figure 26C:
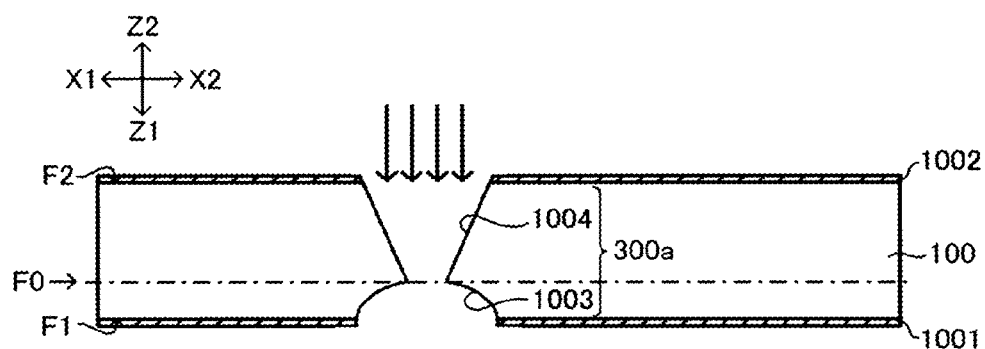
FIG. 26C is a view to illustrate a third step subsequent to the step in FIG. 26B.

Next, as shown in FIG. 26C, double-sided copper-clad laminate 1000 is inversed, for example, and by irradiating a laser from the second-surface (F2) side at double-sided copper-clad laminate 1000, hole 1004 is formed to be contiguous to hole 1003. The shape of hole 1004 corresponds to that of second conductive portion (R12) (see FIG. 25). By connecting hole 1003 and hole 1004, through hole (300a) which penetrates through double-sided copper-clad laminate 1000 is formed. Then, desmearing is conducted on through hole (300a) if required. The shape of through hole (300a) corresponds to that of through-hole conductor (300b) (see FIG. 25), and is like an hourglass. The boundary of hole 1003 and hole 1004 corresponds to narrowed portion (300c) (see FIG. 25). Laser irradiation on first surface (F1) and laser irradiation on second surface (F2) may be conducted simultaneously.

Figure 27A:
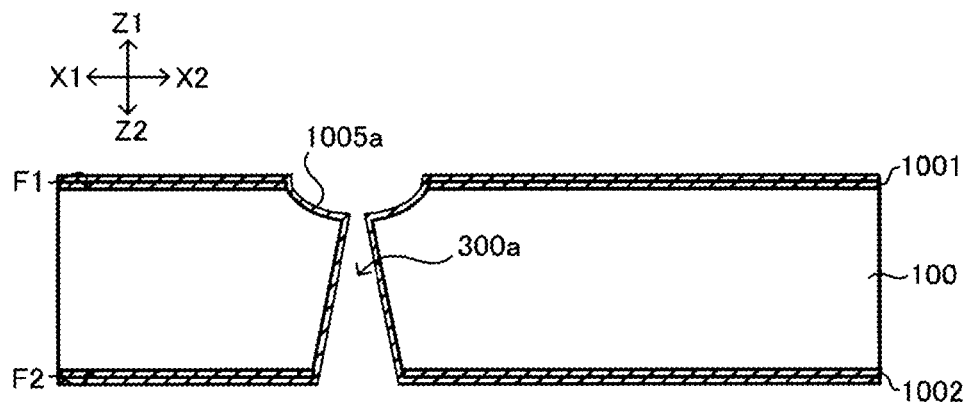
FIG. 27A is a view to illustrate a fourth step subsequent to the step in FIG. 26C.

Next, as shown in FIG. 27A, electroless plating is performed to form electroless copper-plated film (1005a), for example, on copper foils (1001, 1002) and in through hole (300a).

Figure 27B:
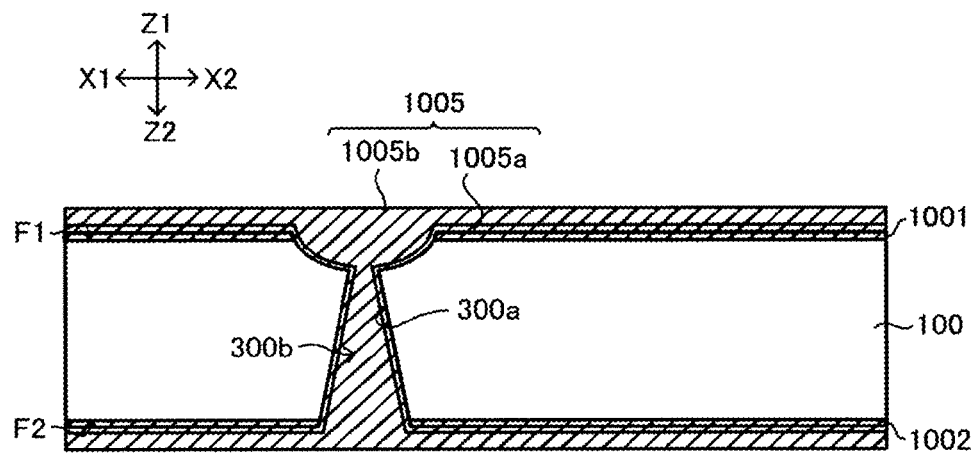
FIG. 27B is a view to illustrate a fifth step subsequent to the step in FIG. 27A.

Next, as shown in FIG. 27B, using a plating solution and electroless plated film (1005a) as a seed layer, electrolytic plating is performed to form electrolytic plating (1005b). In doing so, plating 1005 made of electroless plated film (1005a) and electrolytic plating (1005b) is filled in through hole (300a), and through-hole conductor (300b) is formed.

Next, using etching resist and an etching solution, for example, each conductive layer on first surface (F1) and second surface (F2) of substrate 100 is patterned. Accordingly, conductive layers (301, 302) are respectively formed on first surface (F1) and second surface (F2) of substrate 100 (see FIG. 25). Etching is not limited to a wet type, and a dry type may also be employed.

Figure 28:
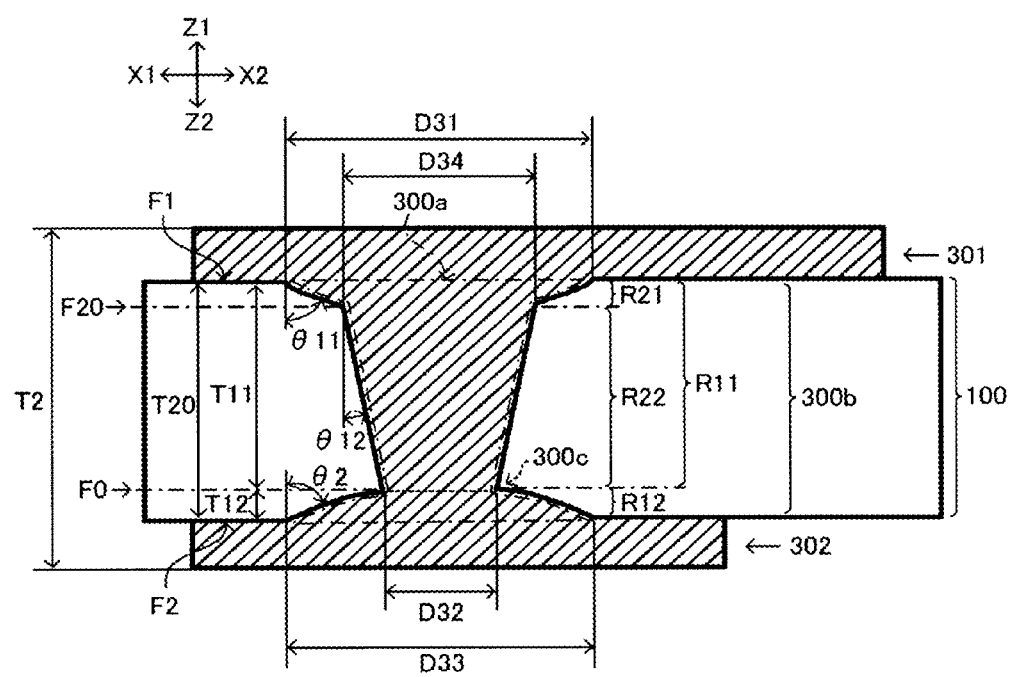
FIG. 28 is a view showing a second alternative example of a through-hole conductor in yet another embodiment of the present invention.

In the above embodiment, taper angles of first conductive portion (R11) and second conductive portion (R12) are each substantially constant in through-hole conductor (300b). However, that is not the only option. For example, as shown in FIG. 28, first conductive portion (R11) may be made up of conductive portion (R21) having taper angle (θ11) and of conductive portion (R22) having taper angle (θ12) which is smaller than taper angle (θ11) (namely, the ratio is smaller at which the width becomes narrower or wider). In the example shown in FIG. 28, through-hole conductor (300b) is formed with the following by connecting them to each other: conductive portion (R21) whose width becomes narrower from first surface (F1) toward boundary surface (F20) between conductive portion (R21) and conductive portion (R22); conductive portion (R22) whose width becomes narrower from boundary surface (F20) toward base surface (F0); and second conductive portion (R12) whose width becomes wider from base surface (F0) toward second surface (F2). Conductive portion (R21), conductive portion (R22) and second conductive portion (R12) are formed to be contiguous (integrated). Side surfaces of conductive portion (R21) and side surfaces of second conductive portion (R12) are each curved, and side surfaces of conductive portion (R22) are planar. Taper angle (θ11) of conductive portion (R21) is substantially the same as taper angle (θ2) of second conductive portion (R12).

In addition, measurement (T12) from second surface (F2) to base surface (F0) is set smaller than measurement (T11) from first surface (F1) to base surface (F0). Regarding measurements of through-hole conductor (300b), width (D31) of an end surface on the first-surface (F1) side, width (D32) of narrowed portion (300c), width (D33) of an end surface on the second-surface (F2) side, and width (D34) of the boundary between conductive portion (R21) and conductive portion (R22) are, from widest to narrowest, width (D31) (=width (D33)), width (D34) and width (D32).

In the following, an example of the method for manufacturing through-hole conductor (300b) shown in FIG. 28 is described with reference to FIGS. 29A~30B.

Figure 29A:
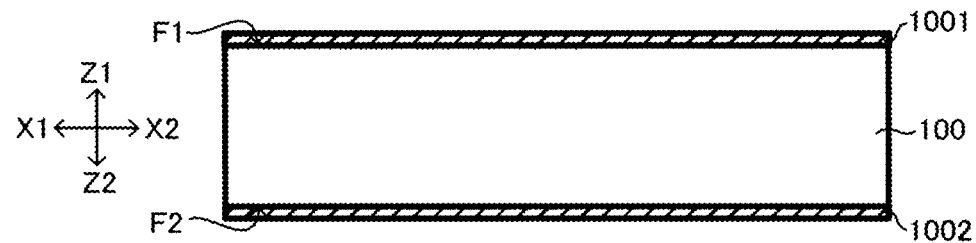
FIG. 29A is a view to illustrate a first step in an example of the method for manufacturing the through-hole conductor shown in FIG. 28.

First, as shown in FIG. 29A, double-sided copper-clad laminate 1000 is prepared, the same as in the above embodiment (see step (S11) in FIG. 7).

Figure 29B:
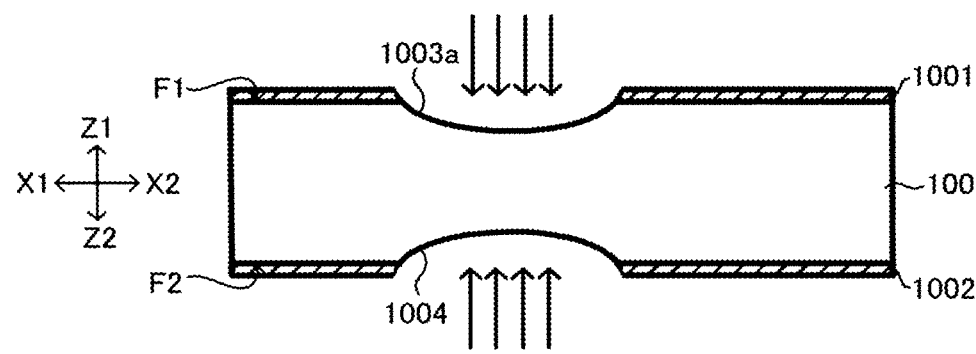
FIG. 29B is a view to illustrate a second step subsequent to the step in FIG. 29A.

Next, as shown in FIG. 29B, a CO₂ laser, for example, is used to irradiate double-sided copper-clad laminate 1000 from the first-surface (F1) side to form hole (1003a), and to irradiate double-sided copper-clad laminate 1000 from the second-surface (F2) side to form hole 1004. Holes (1003a, 1004) each have a bottom, and are formed at substantially the same location on the X-Y plane while being shifted in a direction Z. By being so formed, hole (1003a) and hole 1004 are positioned on either side of substrate 100 and face each other. The shape of hole (1003a) corresponds to that of conductive portion (R21) (see FIG. 28), and the shape of hole 1004 corresponds to that of second conductive portion (R12) (see FIG. 28).

The shapes of holes (1003a, 1004) are each semispherical, for example, tapering with a width that becomes narrower the deeper it goes. Wall surfaces of holes (1003a, 1004) are curved, for example. Laser irradiation on first surface (F1) and laser irradiation on second surface (F2) may be conducted one surface at a time, or simultaneously.

Figure 29C:
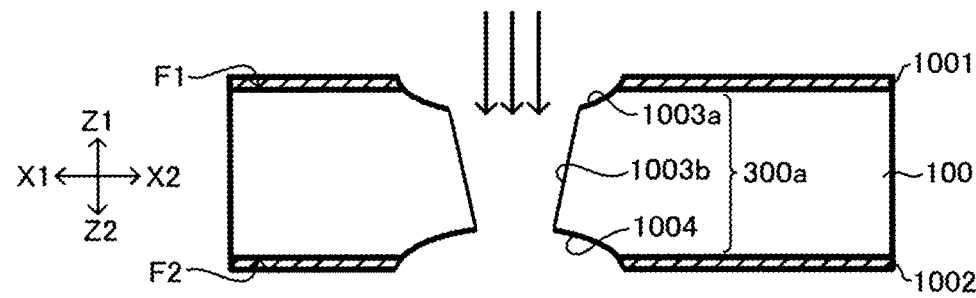
FIG. 29C is a view to illustrate a third step subsequent to the step in FIG. 29B.

Next, as shown in FIG. 29C, a CO₂ laser, for example, is used to irradiate on double-sided copper-clad laminate 1000 (specifically, in hole 1003a) from the first-surface (F1) side to form hole (1003b) which joins hole (1003a) and hole 1004. The shape of hole (1003b) corresponds to that of conductive portion (R22) (see FIG. 28). By connecting hole (1003a), hole (1003b) and hole 1004, through hole (300a) penetrating through double-sided copper-clad laminate 1000 is formed. Then, desmearing is conducted on through hole (300a) if required. The shape of through hole (300a) corresponds to that of through-hole conductor (300b) (see FIG. 28) and is like an hourglass. The boundary of hole (1003b) and hole 1004 corresponds to narrowed portion (300c) (see FIG. 28).

Figure 30A:
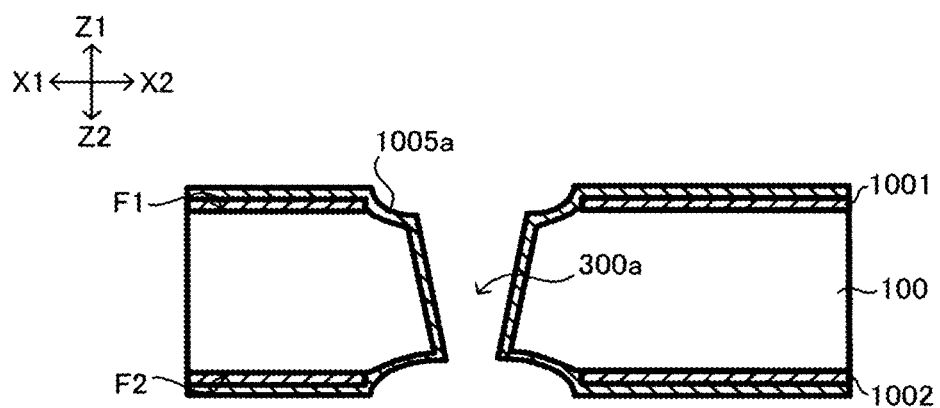
FIG. 30A is a view to illustrate a fourth step subsequent to the step in FIG. 29C.

Next, as shown in FIG. 30A, electroless plating is performed to form electroless copper-plated film (1005a), for example, on copper foils (1001, 1002) and in through hole (300a).

Figure 30B:
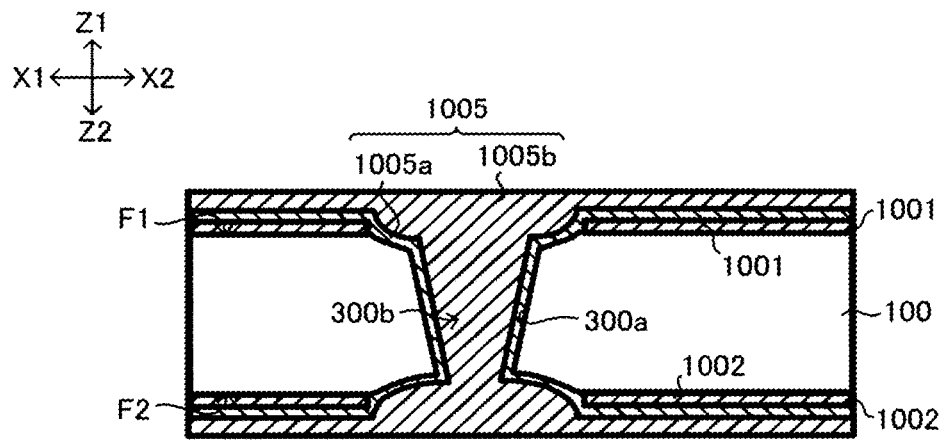
FIG. 30B is a view to illustrate a fifth step subsequent to the step in FIG. 30A.

Next, as shown in FIG. 30B, using a plating solution and electroless plated film (1005a) set as a seed layer, electrolytic plating is performed to form electrolytic plating (1005b). Accordingly, plating 1005 made of electroless plated film (1005a) and electrolytic plating (1005b) is filled in through hole (300a) to form through-hole conductor (300b).

Next, using etching resist and an etching solution, for example, each conductive layer formed on first surface (F1) and second surface (F2) of substrate 100 is patterned. In doing so, conductive layers (301, 302) are formed respectively on first surface (F1) and second surface (F2) of substrate 100 (see FIG. 28). Here, etching is not limited to a wet type, and a dry type may also be employed.

Figure 31:
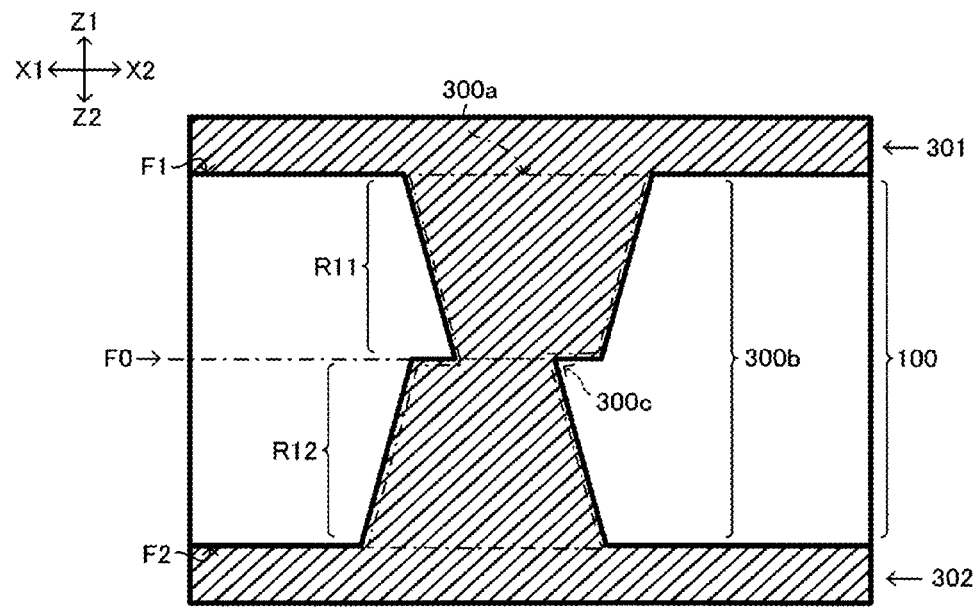
FIG. 31 is a view showing a third alternative example of a through-hole conductor in yet another embodiment of the present invention.

As shown in FIG. 31, first conductive portion (R11) and second conductive portion (R12) in through-hole conductor (300b) may be connected while being shifted in a direction X or a direction Y. Also, the boundary surface between first conductive portion (R11) and second conductive portion (R12) may be inclined to main surfaces of the wiring board, or it may be curved.

Figure 32:
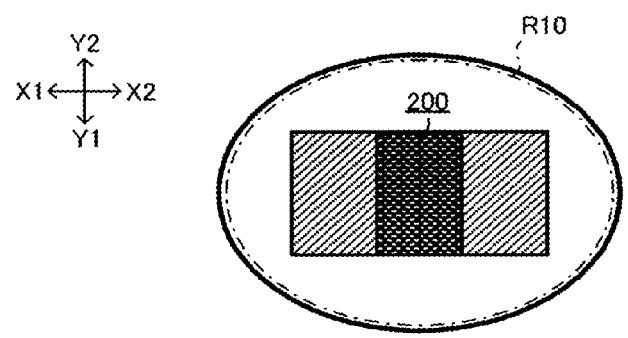
FIG. 32 is a view showing another shape of a cavity in a wiring board according to an embodiment of the present invention.

The shape of capacitor 200 and cavity (R10) is not limited specifically. For example, as shown in FIG. 32, the opening shape of cavity (R10) may be substantially an ellipse. The shape of the main surfaces of capacitor 200 and the opening shape of cavity (R10) may be substantially a circle (substantially a perfect circle). Alternatively, other than substantially a rectangle, their shapes may be substantially a polygon such as substantially a square, substantially a regular hexagon, substantially a regular octagon and the like. The shapes of angles of polygons are not limited specifically, and they may be, for example, substantially right, acute or obtuse, or even roundish.

Figure 33A:
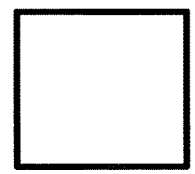
FIG. 33A is a view showing a square as another example of the planar shape of a filled conductor.
Figure 33B:
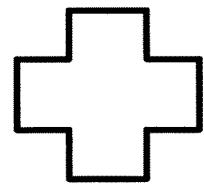
FIG. 33B is a view showing a cross as yet another example of the planar shape of a filled conductor.
Figure 33C:
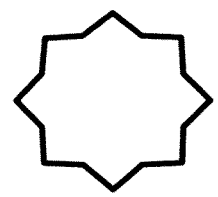
FIG. 33C is a view showing a regular polygonal star as yet another example of the planar shape of a filled conductor.

The planar shapes of filled conductors such as through-hole conductor (300b), via conductor (311b) and the like are not limited to being a circle, and may be any other shape. The planar shape of filled conductors in a wiring board may be a rectangle such as a square as shown in FIG. 33A, for example; or may be shaped like a cross or a regular polygonal star formed by drawing straight lines to radiate out from the center (shapes in which multiple spokes are positioned in a radial pattern) as shown in FIG. 33B or FIG. 33C, for example. Alternatively, the shape may be elliptical, triangular or the like. In addition, the planar shapes of first conductive portion (R11), second conductive portion (R12) and narrowed portion (300c) may be different from each other. For example, the planar shapes of first conductive portion (R11) and second conductive portion (R12) are each circular, while the planar shape of narrowed portion (300c) is rectangular.

In the above embodiment, the wiring board has a double-sided via structure to capacitor 200. However, that is not the only option. For example, as shown in FIG. 34, via conductors (311b) electrically connecting electrodes (210, 220) of capacitor 200 may be formed only on one side of the wiring board.

The above embodiment showed a wiring board (wiring board 10) where only one capacitor 200 is accommodated in cavity (R10) (accommodation space for capacitor 200). However, that is not the only option. For example, it may be a wiring board having multiple capacitors 200 in cavity (R10). Multiple capacitors 200 may be arrayed along a lamination direction (a direction Z) or may be arrayed along a direction X or a direction Y. Alternatively, multiple cavities (R10) may be formed.

The above embodiment showed a double-sided wiring board (wiring board 10) having conductive layers on both sides of a core substrate. However, that is not the only option. For example, as shown in FIG. 34, it may be a single-sided wiring board having first buildup section (B1) (including conductive layer 110) only on one side of the core substrate (substrate 100).

Figure 34:
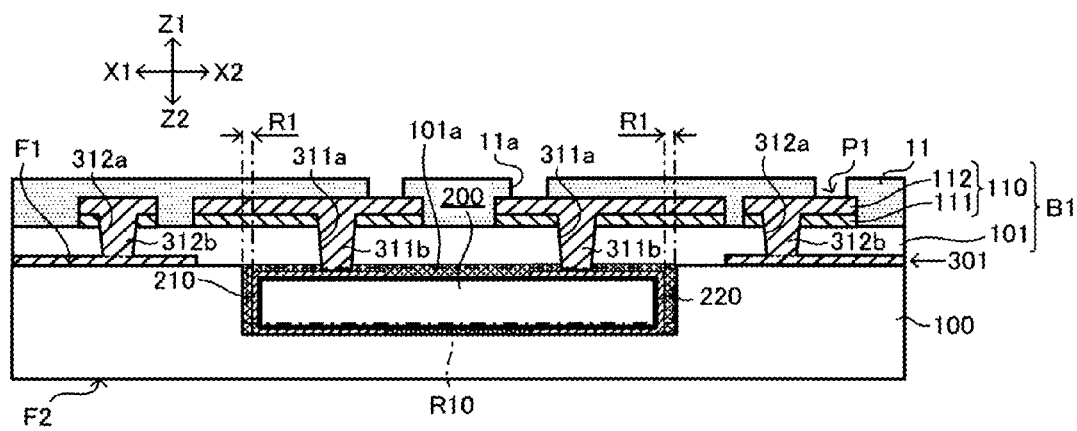
FIG. 34 is a view showing a single-sided wiring board in yet another embodiment of the present invention.

Also, as shown in FIG. 34, for example, cavity (R10) (accommodation space for capacitor 200) may be a hole (concave) that does not penetrate through substrate 100. In such a case as well, the thickness of capacitor 200 is preferred to be substantially the same as the depth of cavity (R10) (hole).

The above embodiment showed an example in which the thickness of substrate 100 is substantially the same as the thickness of capacitor 200. However, that is not the only option. For example, as shown in FIG. 34, the thickness of substrate 100 may be set greater than the thickness of capacitor 200.

Figure 35:
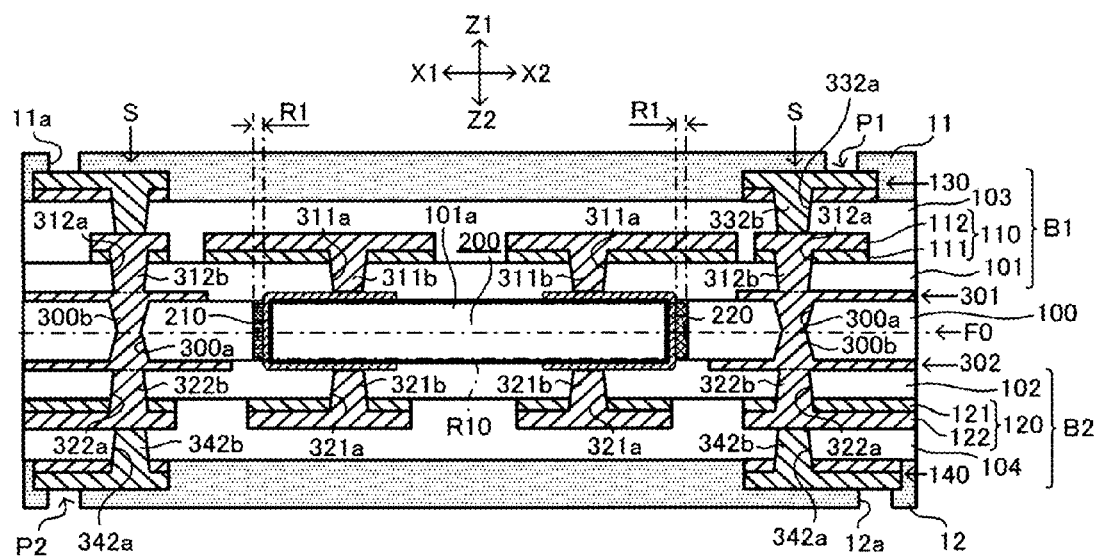
FIG. 35 is a view showing a wiring board having a further multilayered structure in yet another embodiment of the present invention.

A wiring board may have two or more buildup layers on either side of substrate 100 (core substrate). For example, as shown in FIG. 35, two insulation layers (101, 103) and two conductive layers (110, 130) are alternately laminated on the first-surface (F1) side of substrate 100, and two insulation layers (102, 104) and two conductive layers (120, 140) are alternately laminated on the second-surface (F2) side of substrate 100. In the example shown in FIG. 35, conductive layer 110 on insulation layer 101 and conductive layer 130 on insulation layer 103 are electrically connected to each other by via conductor (332b) in hole (332a) (via hole) formed in insulation layer 103. Also, conductive layer 120 on insulation layer 102 and conductive layer 140 on insulation layer 104 are electrically connected to each other by via conductor (342b) in hole (342a) (via hole) formed in insulation layer 104. Through-hole conductor (300b) and via conductors (312b, 322b, 332b, 342b) are each a filled conductor, and they are stacked in a direction Z to form filled-stack structure S.

In the example shown in FIG. 35, all the via conductors (via conductors 311b, 312b and 332b) included in first buildup section (B1) formed on the first-surface (F1) side of substrate 100 (core substrate) each have a width that becomes narrower toward base surface (F0), and all the via conductors (via conductors 321b, 322b and 342b) included in second buildup section (B2) formed on the second-surface (F2) side of substrate 100 (core substrate) each have a width that becomes narrower toward base surface (F0). Accordingly, it is thought that stress and the like tend to concentrate on base surface (F0) in substrate 100 (core substrate) and that stress is uniformly distributed on the X-Y plane. As a result, warping is suppressed in the wiring board and electrical connection reliability is enhanced in the wiring board. Especially, when all the via conductors (via conductors 311b and 312b) formed in insulation layer 101 (first insulation layer) have a width that becomes narrower toward base surface (F0) as well as all the via conductors (via conductors 321b and 322b) formed in insulation layer 102 (second insulation layer) have a width that becomes narrower toward base surface (F0), such a structure contributes to the above-described effect of suppressing warping in a wiring board.

In addition, the numbers of buildup layers may be different on the first-surface (F1) side of substrate 100 and on the second-surface (F2) side of substrate 100. However, to mitigate stress, it is considered preferable for the numbers of buildup layers to be set the same on the first-surface (F1) side of substrate 100 and on the second-surface (F2) side of substrate 100 so that symmetry is enhanced on the upper and lower sides.

Figure 36:
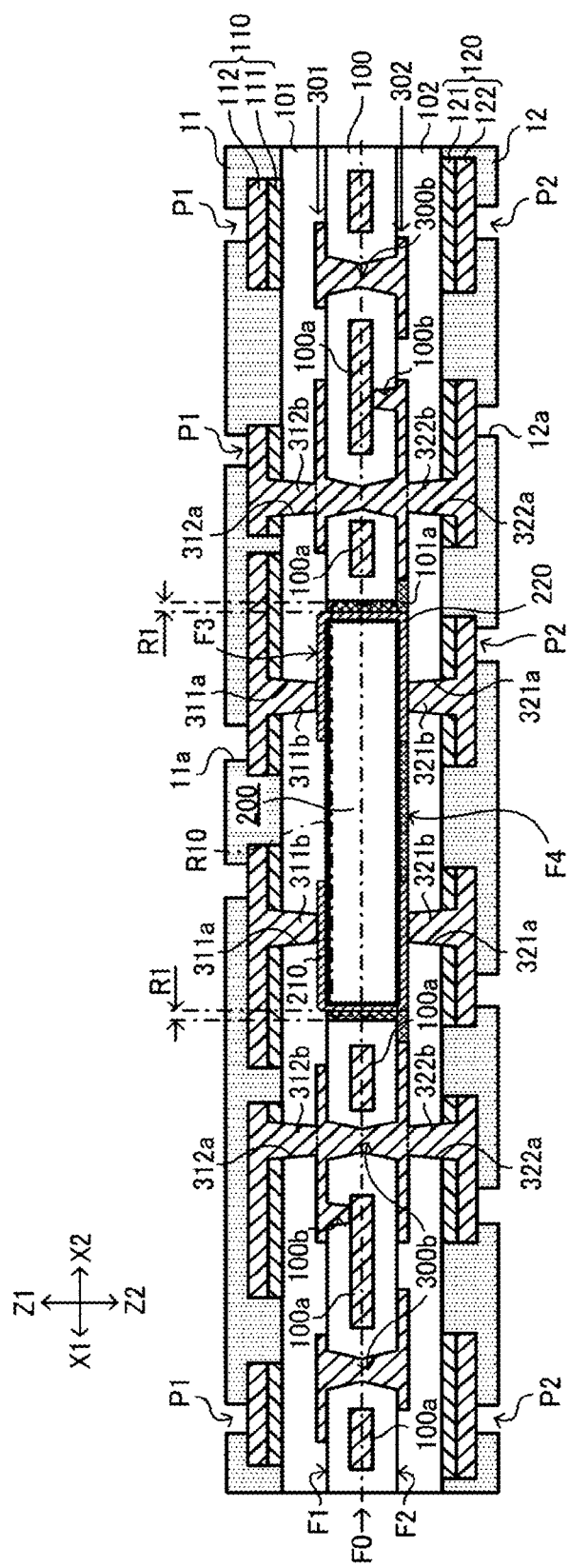
FIG. 36 is a view showing a wiring board having a core substrate with a built-in metal sheet in yet another embodiment of the present invention.
Figure 37A:
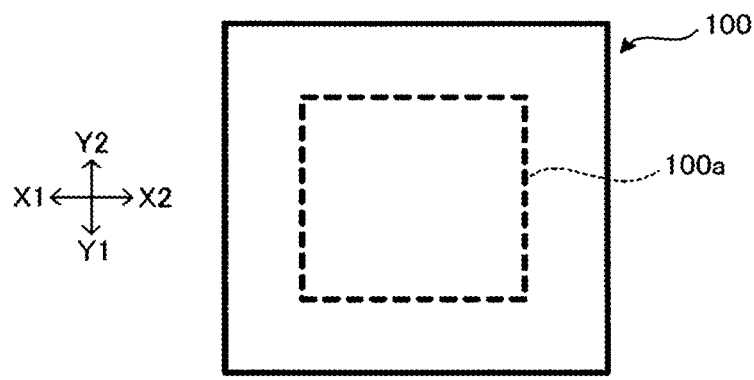
FIG. 37A is a view showing a first shape of the metal sheet used in the wiring board shown in FIG. 36.
Figure 37B:
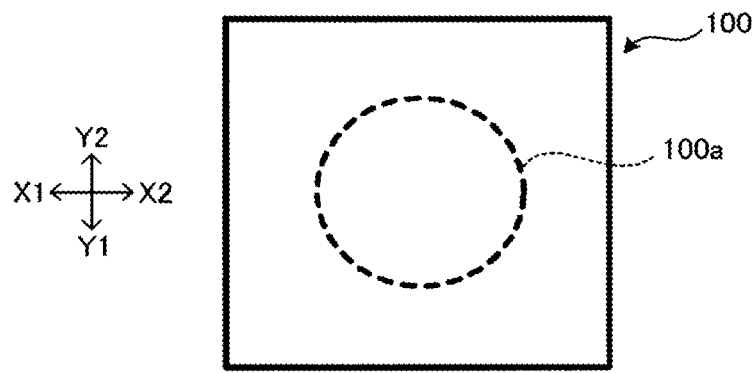
FIG. 37B is a view showing a second shape of the metal sheet used in the wiring board shown in FIG. 36.

As shown in FIG. 36, substrate 100 (core substrate) may have built-in metal sheet (100a) (such as copper foil). In such substrate 100, heat dissipation is enhanced by metal sheet (100a). In the example shown in FIG. 36, via conductor (100b) reaching metal sheet (100a) is formed in substrate 100, and metal sheet (100a) and a ground line (conductive pattern included in conductive layer 301 or 302) are electrically connected to each other through via conductor (100b). Metal sheet (100a) is preferred to be positioned near base surface (F0) as shown in FIG. 36. The planar shape of metal sheet (100a) is not limited specifically, and it may be rectangular as shown in FIG. 37A, for example, or it may be circular as shown in FIG. 37B, for example.

Figure 38:
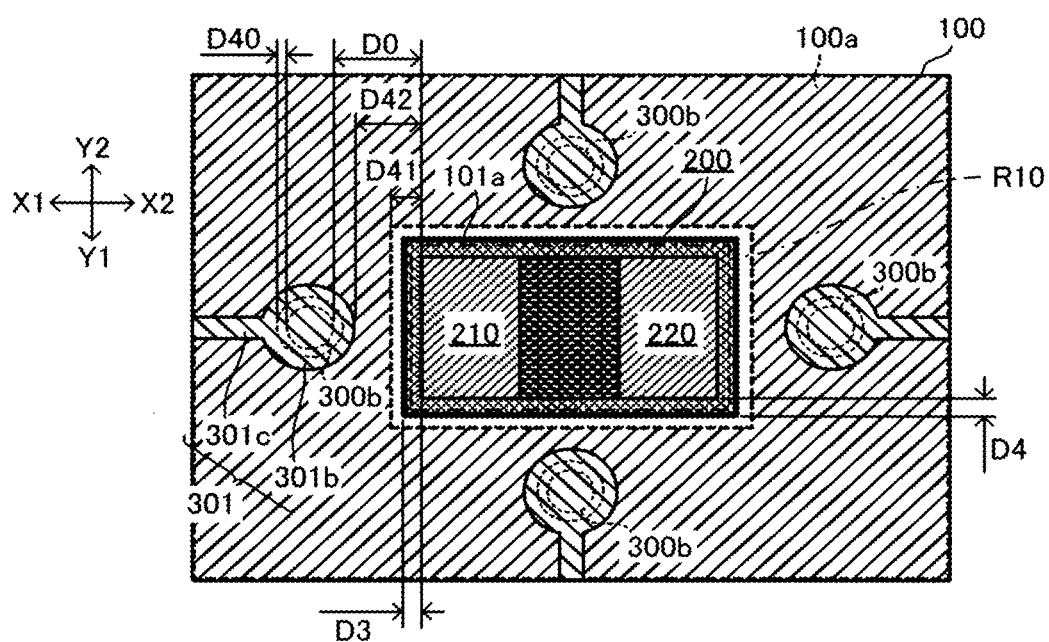
FIG. 38 is a view, in the wiring board shown in FIG. 36, showing a first state between a built-in metal sheet in the wiring board and a conductive layer on the core substrate.

Metal sheet (100a) may be formed to surround cavity (R10) (opening portion) as shown in FIG. 38, for example. In the example shown in FIG. 38, through-hole conductors (300b) are positioned in four sides around cavity (R10). Land (301b) of through-hole conductor (300b) and wiring (301c) connected to land (301b) are formed on substrate 100 (core substrate). Land (301b) and wiring (301c) are included in conductive layer 301.

In the example shown in FIG. 38, metal sheet (100a) is formed on substantially the entire surface excluding the vicinity of the penetrating section (cavity (R10) or through hole (300a), etc.) of substrate 100 (core substrate). Metal sheet (100a) is formed to avoid the vicinity of the penetrating section (for example, the range of distance (D40) from the penetrating section). Distance (D40) is 120 μm, for example. In addition, conductive layer 301 on substrate 100 (core substrate) is formed to be farther away from cavity (R10) (opening portion) than metal sheet (100a) is. Namely, conductive layer 301 and metal sheet (100a) are each formed to avoid the vicinity of cavity (R10). Moreover, part of metal sheet (100a) is positioned between through-hole conductor (300b) (or through hole 300a) and cavity (R10).

Following are examples of preferred measurements in FIG. 38. Distance (D41) between capacitor 200 and metal sheet (100a) is 160 μm, for example. Clearance (R1) (width (D3) or width (D4)) between capacitor 200 and substrate 100 is 40 μm, for example.

Metal sheet (100a) is not formed, for example, in the range of 120 μm from cavity (R10) (distance D41-width D3). In addition, conductive layer 301 on substrate 100 (core substrate) is formed to be farther away from cavity (R10) (opening portion) than metal sheet (100a) is. Namely, conductive layer 301 and metal sheet (100a) are each formed to avoid the vicinity of cavity (R10).

Figure 39A:
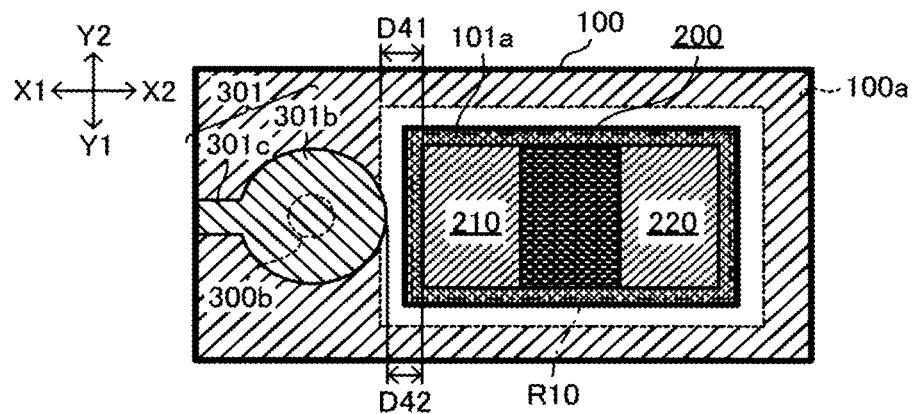
FIG. 39A is a view, in the wiring board shown in FIG. 36, showing a second state between a built-in metal sheet in the wiring board and a conductive layer on the core substrate.
Figure 39B:
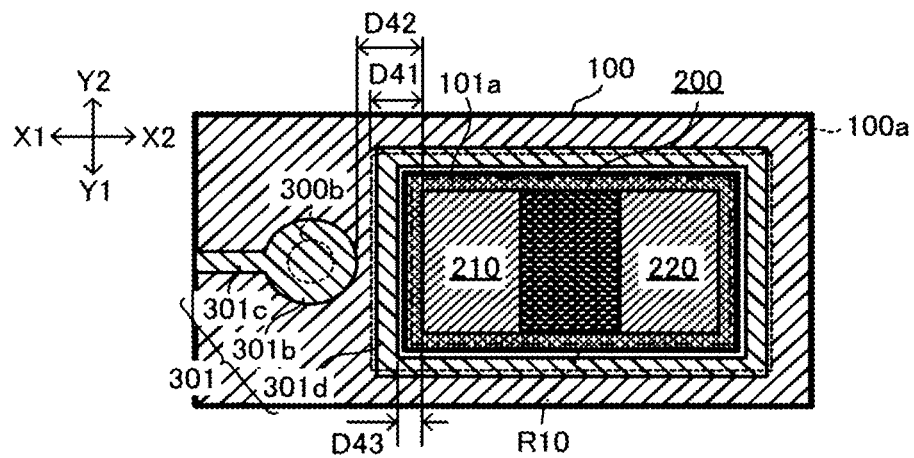
FIG. 39B is a view, in the wiring board shown in FIG. 36, showing a third state between a built-in metal sheet in the wiring board and a conductive layer on the core substrate.
Figure 39C:
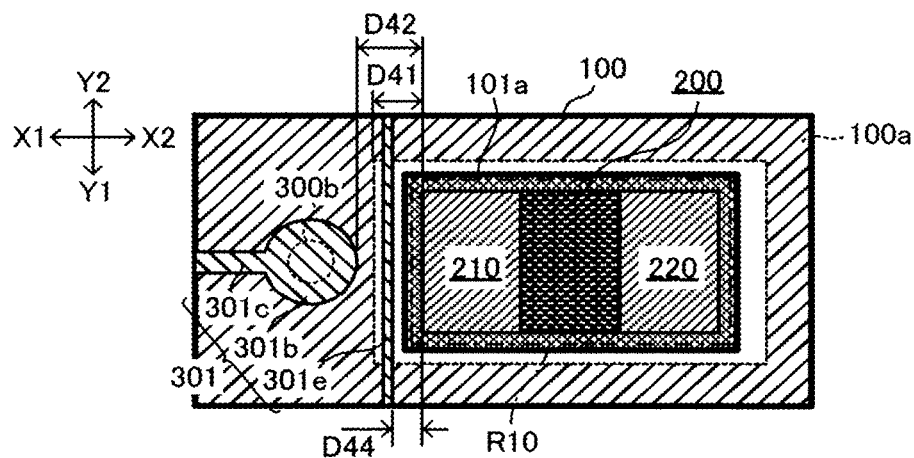
FIG. 39C is a view, in the wiring board shown in FIG. 36, showing a fourth state between a built-in metal sheet in the wiring board and a conductive layer on the core substrate.

Conductive layer 301 on substrate 100 (core substrate) may be formed in a position closer to cavity (R10) (opening portion) than metal sheet (100a) is, as shown in FIGS. 39A~39C, for example.

In the example shown in FIG. 39A, land (301b) of through-hole conductor (300b) is positioned closer to cavity (R10) (opening portion) than metal sheet (100a) is. Namely, distance (D42) between capacitor 200 and land (301b) is smaller than distance (D41) between capacitor 200 and metal sheet (100a).

In the example shown in FIG. 39B, reinforcing pattern (301d) of conductive layer 301 is positioned closer to cavity (R10) (opening portion) than metal sheet (100a) is. Namely, distance (D43) between capacitor 200 and reinforcing pattern (301d) is smaller than distance (D41) between capacitor 200 and metal sheet (100a). In the example shown in FIG. 39B, reinforcing pattern (301d) with a ring-shape outline is formed to surround cavity (R10) (opening portion).

In the example shown in FIG. 39C, wiring pattern (301e) included in conductive layer 301 is positioned closer to cavity (R10) (opening portion) than metal sheet (100a) is. Namely, distance (D44) between capacitor 200 and wiring pattern (301e) is smaller than distance (D41) between capacitor 200 and metal sheet (100a).

In the following, an example of a method for manufacturing substrate 100 (core substrate) shown in FIG. 36 is described with reference to FIGS. 40A and 40B.

Figure 40A:
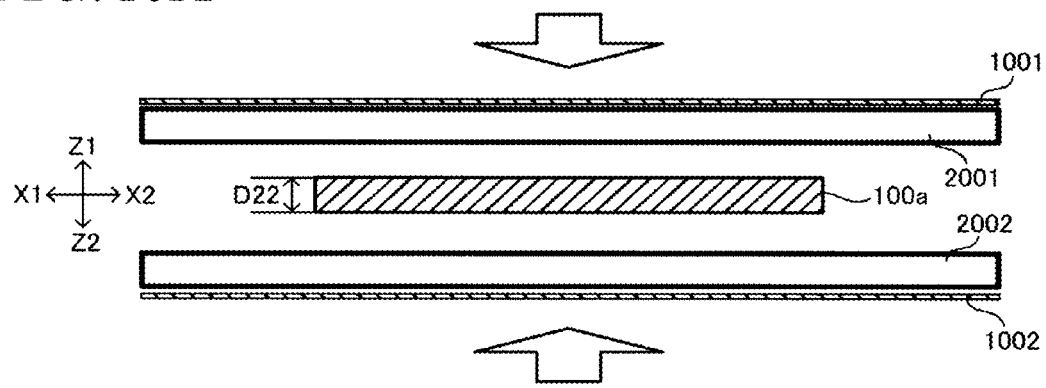
FIG. 40A is a view to illustrate a first step for manufacturing a core substrate to be used in the wiring board shown in FIG. 36.
Figure 40B:
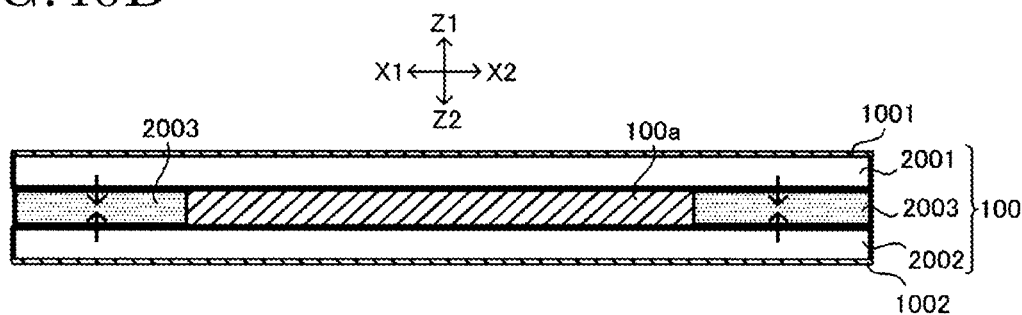
FIG. 40B is a view to illustrate a second step subsequent to the step in FIG. 40A.

First, as shown in FIG. 40A, insulation layers (2001, 2002) are positioned to sandwich metal sheet (100a) made of copper foil, for example, followed by further positioning copper foil 1001 on insulation layer 2001 and copper foil 1002 on insulation layer 2002. Accordingly, insulation layer 2001 (first resin insulation layer), metal sheet (1001a) with a predetermined pattern, and insulation layer 2002 (second resin insulation layer) are laminated in that order. Insulation layers (2001, 2002) are each made of glass-epoxy prepreg, for example. Metal sheet (100a) has a pattern shown in FIG. 38 (on the X-Y plane), for example. Thickness (D22) of metal sheet (100a) is 35 μm, for example.

Next, the laminate of copper foil 1001, insulation layer 2001, metal sheet (100a), insulation layer 2002 and copper foil 1002 is pressed so that pressure is added toward metal sheet (100a). By pressing semi-cured insulation layers (2001, 2002), resin from insulation layers (2001, 2002) respectively flows out as shown in FIG. 40B. Accordingly, resin from insulation layer 2001 or 2002 is filled in portions at the sides of metal sheet (100a) (portions where metal sheet (100a) is not present in the pattern of metal sheet (1001a)), and insulation layer 2003 is formed. Then, insulation layers (2001, 2002, 2003) are each thermally cured. Accordingly, substrate 100 (core substrate) with built-in metal sheet (100a) is completed.

Figure 41:
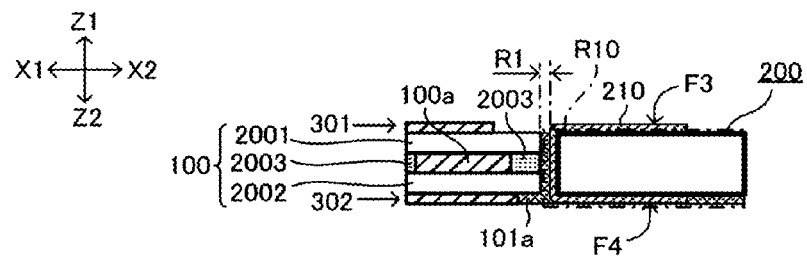
FIG. 41 is a view, in the wiring board shown in FIG. 36, showing the vicinity of a boundary between a core substrate and a capacitor positioned in an opening portion formed in the core substrate.

In a wiring board manufactured as above, as shown in FIG. 41, insulator (101a) (first insulator) is filled in clearance (R1) between capacitor 200 in cavity (R10) (opening portion) and substrate 100 (core substrate), and substrate 100 has insulation layer 2003 (second insulator) between metal sheet (100a) and cavity (R10). Insulation layer 2003 is made of different material from that of insulator (101a). In particular, insulator (101a) is made of resin from insulation layer 101 or 102, which is formed on substrate 100 and on capacitor 200 and is extended beyond clearance (R1) between capacitor 200 in cavity (R10) and substrate 100 (see FIG. 19A). On the other hand, insulation layer 2003 is made of resin from insulation layers (2001, 2002) (see FIG. 40B). Here, each resin that forms insulation layers (101, 102) has a lower thermal expansion coefficient (CTE) than each resin that forms insulation layers (2001, 2002). Thus, the thermal expansion coefficient of insulator (101a) is set lower than that of insulation layer 2003. Accordingly, CTE mismatching is mitigated between the capacitor and the resin, enhancing adhesiveness between the capacitor and the resin. Insulation layers (101, 102) are each made of epoxy-resin film with inorganic filler (inorganic filler content of 40% or more), for example, and insulation layers (2001, 2002) are each made of prepreg (epoxy-resin sheet containing glass material), for example.

The structure of wiring board 10, as well as the type, performance, measurements, quality, shapes, number of layers, positioning and so forth of the elements of such a structure, may be modified freely within a scope that does not deviate from the gist of the present invention.

The electrodes (210, 220) of capacitor 200 are not limited to being U shaped, and they may be a pair of planar electrodes that sandwich capacitor body 201.

The type of capacitor 200 is not limited to an MLCC, and any other type may be used.

For example, via conductors (311b) and the like are not limited to filled conductors, and they may be conformal conductors, for example.

To mount capacitor 200 through via connection (via conductors (311b, 321b)) is not the only option. It may be mounted using other methods such as wire bonding.

The process for manufacturing a wiring board is not limited to the order and contents shown in FIG. 7. Its order and contents may be modified within a scope that does not deviate from the gist of the present invention. Also, some steps may be omitted if not required, depending on usage or the like.

For example, any method may be taken for forming each conductive layer. For example, any one method of the following or any combination of two or more of them may be used for forming conductive layers: panel plating, pattern plating, full-additive, semi-additive (SAP), subtractive, transfer and tenting methods.

Also, instead of a laser, wet or dry etching may be used for processing. When etching process is employed, it is considered preferable to protect in advance with resist or the like portions which are not required to be removed.

The above embodiment and modified examples may be combined freely. Selecting an appropriate combination according to usage requirements or the like is considered preferable. For example, the structure shown in FIG. 25 or FIG. 28 may be applied to any structure shown in FIGS. 31~37B.

A wiring board according to an embodiment of the present invention includes a core substrate having a first surface, a second surface opposite the first surface, an opening portion that penetrates from the first surface to the second surface, and a through hole; as well as a capacitor positioned in the opening portion. In such a wiring board, the through hole is filled with conductor, and the conductor is made up of a first conductive portion that becomes narrower from the first surface toward the second surface and of a second conductive portion that becomes narrower from the second surface toward the first surface, and the first conductive portion and the second conductive portion are connected in the core substrate.

A method for manufacturing a wiring board according to an embodiment of the present invention includes the following: preparing a substrate having a first surface and a second surface opposite the first surface; forming an opening portion that penetrates through the substrate; positioning a capacitor in the opening portion; forming in the substrate a through hole to have a portion that becomes narrower from the first surface toward the second surface and a portion that becomes narrower from the second surface toward the first surface; and filling conductor in the through hole.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a core substrate having an opening portion and a through hole adjacent to the opening portion;
   a capacitor positioned in the opening portion; and
   a through-hole conductor formed in the through hole of the core substrate and comprising a conductor filling the through hole, wherein the core substrate has a first surface and a second surface on an opposite side of the first surface, the opening portion of the core substrate penetrates from the first surface to the second surface, the through-hole conductor has a first conductive portion and a second conductive portion directly connected to the first conductive portion in the core substrate, the first conductive portion of the through-hole conductor becomes narrower from the first surface of the core substrate toward the second surface of the core substrate, the second conductive portion of the through-hole conductor becomes narrower from the second surface of the core substrate toward the first surface of the core substrate, the capacitor has an electrode having a side electrode portion, and the side electrode portion of the electrode bulges out further in a middle portion of the side electrode portion of the electrode than in end portions of the side electrode portion of the electrode in a thickness direction of the capacitor such that a distance between the through-hole conductor and the side electrode portion is substantially constant in a thickness direction of the capacitor.

2. The wiring board according to claim 1, further comprising:
   a first insulation layer formed on the first surface of the core substrate;
   a second insulation layer formed on the second surface of the core substrate;
   a first via conductor formed in the first insulation layer; and
   a second via conductor formed in the second insulation layer,
   wherein the first and second via conductor comprise conductors filling first and second via holes formed in the first and second insulation layers, respectively, and the first and second via conductors become narrower toward the capacitor and are electrically connected to an electrode of the capacitor.

3. The wiring board according to claim 1, further comprising:
   a first insulation layer formed on the first surface of the core substrate;
   a second insulation layer formed on the second surface of the core substrate;
   a plurality of first via conductors formed in the first insulation layer; and
   a plurality of second via conductors formed in the second insulation layer,
   wherein the first and second via conductors comprise conductors filling first and second via holes formed in the first and second insulation layers, respectively, and the first and second via conductors become narrower toward the capacitor and include a plurality of via conductors electrically connected to electrodes of the capacitor.

4. The wiring board according to claim 1, further comprising:
   a first buildup structure formed on the first surface of the core substrate;
   a second buildup structure formed on the second surface of the core substrate;
   a plurality of first via conductors formed in the first buildup structure; and
   a plurality of second via conductors formed in the second buildup structure,
   wherein the first and second via conductors comprise conductors filling first and second via holes formed in the first and second insulation layers, respectively, the first via conductors become narrower toward the first surface of the core substrate, and the second via conductors become narrower toward the second surface of the core substrate.

5. The wiring board according to claim 1, further comprising:
   a first insulation layer formed on the first surface of the core substrate;
   a second insulation layer formed on the second surface of the core substrate;
   a plurality of first via conductors formed in the first insulation layer; and
   a plurality of second via conductors formed in the second insulation layer,
   wherein the first and second via conductors comprise conductors filling first and second via holes formed in the first and second insulation layers, respectively, the first via conductors become narrower toward the first surface of the core substrate, the second via conductors become narrower toward the second surface of the core substrate, the plurality of first via conductors has positions and shapes which are symmetrical to the plurality of second via conductors.

6. The wiring board according to claim 1, wherein the core substrate has a thickness which is in a range of 0.4 mm to 1.0 mm, and the core substrate has a thermal expansion coefficient which is set lower than a thermal expansion coefficient of the capacitor.

7. The wiring board according to claim 1, further comprising:
   a first conductive layer formed on the first surface of the core substrate; and
   a second conductive layer formed on the second surface of the core substrate,
   wherein the core substrate and the capacitor satisfy that T3/T2 is in a range of 0.8 to 1.25, and T3/T1 is in a range of 0.4 to 0.7, where T1 is a thickness of the wiring board, T2 is a sum of thicknesses of the core substrate and the first and second conductive layers on the first and second surfaces, respectively, and T3 is a thickness of the capacitor.

8. The wiring board according to claim 1, wherein the capacitor has at least one of surfaces occupied by at least one electrode of the capacitor at a rate of 40% to 90% in area.

9. The wiring board according to claim 1, wherein the core substrate has a built-in metal sheet.

10. The wiring board according to claim 9, wherein the core substrate has a built-in metal sheet surrounding the opening portion of the core substrate.

11. The wiring board according to claim 1, wherein the core substrate has a built-in metal sheet positioned between the through hole and the opening portion in the core substrate.

12. The wiring board according to claim 1, wherein the core substrate has a built-in metal sheet, the core substrate and the capacitor in the opening portion form a clearance filled with a first insulator, the core substrate has a second insulator filling a space between the built-in metal sheet and the opening portion, and the second insulator is made of a material different from a material of the first insulator.

13. The wiring board according to claim 12, wherein the first insulator has a thermal expansion coefficient which is lower than a thermal expansion coefficient of the second insulator.

14. The wiring board according to claim 12, further comprising an insulation layer formed on the core substrate and the capacitor such that the insulation layer extends over the clearance between the core substrate and the capacitor in the opening portion, wherein the first insulator is made of a resin from the insulation layer.

15. A method for manufacturing a wiring board, comprising:
preparing a substrate having a first surface and a second surface on an opposite side of the first surface;
forming in the substrate an opening portion penetrating through the substrate;
positioning a capacitor in the opening portion of the substrate;
forming in the substrate a through hole such that the through hole has a first portion which becomes narrower from the first surface of the substrate toward the second surface of the substrate and a second portion which becomes narrower from the second surface of the substrate toward the first surface of the substrate; and
filling a conductor in the through hole such that a through-hole conductor having a first conductive portion and a second conductive portion directly connected to the first conductive portion in the substrate is formed in the substrate,
wherein the opening portion and the through hole are positioned adjacent to each other, the capacitor has an electrode having a side electrode portion, and the side electrode portion of the electrode bulges out further in a middle portion of the side electrode portion of the electrode than in end portions of the side electrode portion of the electrode in a thickness direction of the capacitor such that a distance between the through-hole conductor and the side electrode portion is substantially constant in a thickness direction of the capacitor.

16. The method for manufacturing a wiring board according to claim 15, wherein the substrate has a built-in metal sheet.

17. The method for manufacturing a wiring board according to claim 16, wherein the preparing of the substrate includes forming a laminate comprising a first resin insulation layer, a metal sheet with a pattern and a second resin insulation layer laminated in an order of the first resin insulation layer, the metal sheet and the second resin insulation layer, and pressing the laminate such that a resin from at least one of the first resin insulation layer and the second resin insulation layer fills in an opening space or spaces in the pattern of the metal sheet.

18. The method for manufacturing a wiring board according to claim 16, wherein the substrate has the built-in metal sheet between the through hole and the opening portion in the substrate.

* * * * *